US009110382B2

(12) United States Patent
Chen

(10) Patent No.: US 9,110,382 B2
(45) Date of Patent: Aug. 18, 2015

(54) SOURCE POLARIZATION OPTIMIZATION

(75) Inventor: Luoqi Chen, Saratoga, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 954 days.

(21) Appl. No.: 13/241,140

(22) Filed: Sep. 22, 2011

(65) Prior Publication Data

US 2012/0075605 A1 Mar. 29, 2012

Related U.S. Application Data

(60) Provisional application No. 61/385,933, filed on Sep. 23, 2010.

(51) Int. Cl.
*G03B 27/68* (2006.01)
*G03B 27/32* (2006.01)
*G03F 7/20* (2006.01)
(Continued)

(52) U.S. Cl.
CPC ............ *G03F 7/70566* (2013.01); *G03F 7/705* (2013.01); *G03F 7/70125* (2013.01); *H01L 21/027* (2013.01); *G03F 7/20* (2013.01)

(58) Field of Classification Search
CPC ............ G03F 7/70083; G03F 7/71258; G03F 7/70133; G03F 7/105; G03F 7/70566; H01L 21/027
USPC ........ 355/52, 53, 55, 67–71, 77; 430/5, 8, 22, 430/30, 311, 321; 716/50–56; 250/492.1, 250/492.2, 492.22, 548
See application file for complete search history.

(56) References Cited

U.S. PATENT DOCUMENTS 6,563,566 B2 * 5/2003 Rosenbluth et al. ............ 355/67
6,737,662 B2   5/2004 Mulder et al.
7,015,491 B2   3/2006 Eurlings et al.
(Continued)

FOREIGN PATENT DOCUMENTS

JP   2005-183938   7/2005
JP   2010-117716   5/2010
WO  2010/059954   5/2010

OTHER PUBLICATIONS

Nabila Baba-Ali et al., "Overcoming the Resolution Challenge Using Special Illumination Techniques to Print 50/50 nm Nested Contact Holes at 157 nm Wavelength," Proc. of SPIE, vol. 5040, pp. 1352-1362 (2003).
(Continued)

*Primary Examiner* — Christina Riddle
(74) *Attorney, Agent, or Firm* — Pillsbury Winthrop Shaw Pittman LLP

(57) ABSTRACT

A lithographic simulation process is described, where each source point in a preselected group of source points at a pupil plane of an illumination source is represented by one or more variable parameters, wherein at least some of the variable parameters characterize a polarization state at the source point. One or both of the preselected group of source points in the illumination source and a representation of the design layout are iteratively reconfigured based on a computed gradient of a cost function with respect to the one or more variable parameters until a desired lithographic response is obtained, wherein the cost function comprises an aerial image intensity of a representation of the design layout projected using the preselected group of source points. Physical hardware to implement the source polarization variation is also described.

20 Claims, 25 Drawing Sheets

(51) Int. Cl.
*H01L 21/027* (2006.01)
*G03B 27/54* (2006.01)

(56) References Cited

U.S. PATENT DOCUMENTS

| | | | |
|---|---|---|---|
| 7,039,896 B2* | 5/2006 | Medvedeva et al. | 716/53 |
| 7,245,356 B2 | 7/2007 | Hansen | |
| 7,292,315 B2 | 11/2007 | Socha et al. | |
| 7,525,642 B2 | 4/2009 | Mulder et al. | |
| 8,612,904 B1* | 12/2013 | Wang et al. | 716/56 |
| 2005/0134822 A1 | 6/2005 | Socha et al. | |
| 2006/0046168 A1* | 3/2006 | Fukuhara | 430/30 |
| 2006/0048089 A1* | 3/2006 | Schwarzband | 716/21 |
| 2006/0126046 A1 | 6/2006 | Hansen | |
| 2007/0011648 A1* | 1/2007 | Abrams | 716/21 |
| 2007/0157154 A1* | 7/2007 | Socha | 716/21 |
| 2009/0070083 A1 | 3/2009 | Zhang et al. | |
| 2009/0174877 A1 | 7/2009 | Mulder et al. | |
| 2009/0287461 A1 | 11/2009 | Lee et al. | |
| 2010/0122225 A1 | 5/2010 | Cao et al. | |
| 2011/0139027 A1* | 6/2011 | Hansen | 101/450.1 |
| 2011/0228247 A1 | 9/2011 | Mulder et al. | |
| 2011/0230999 A1 | 9/2011 | Chen et al. | |

OTHER PUBLICATIONS

Japanese Office Action mailed Oct. 30, 2012 in corresponding Japanese Patent Application No. 2011-202521.

* cited by examiner

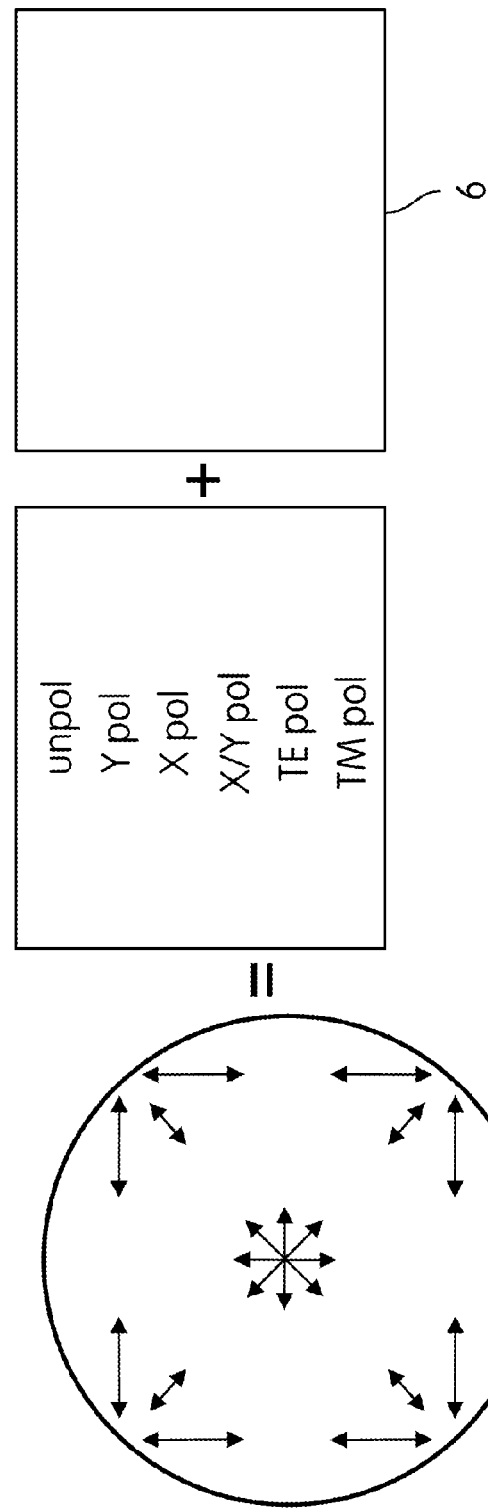

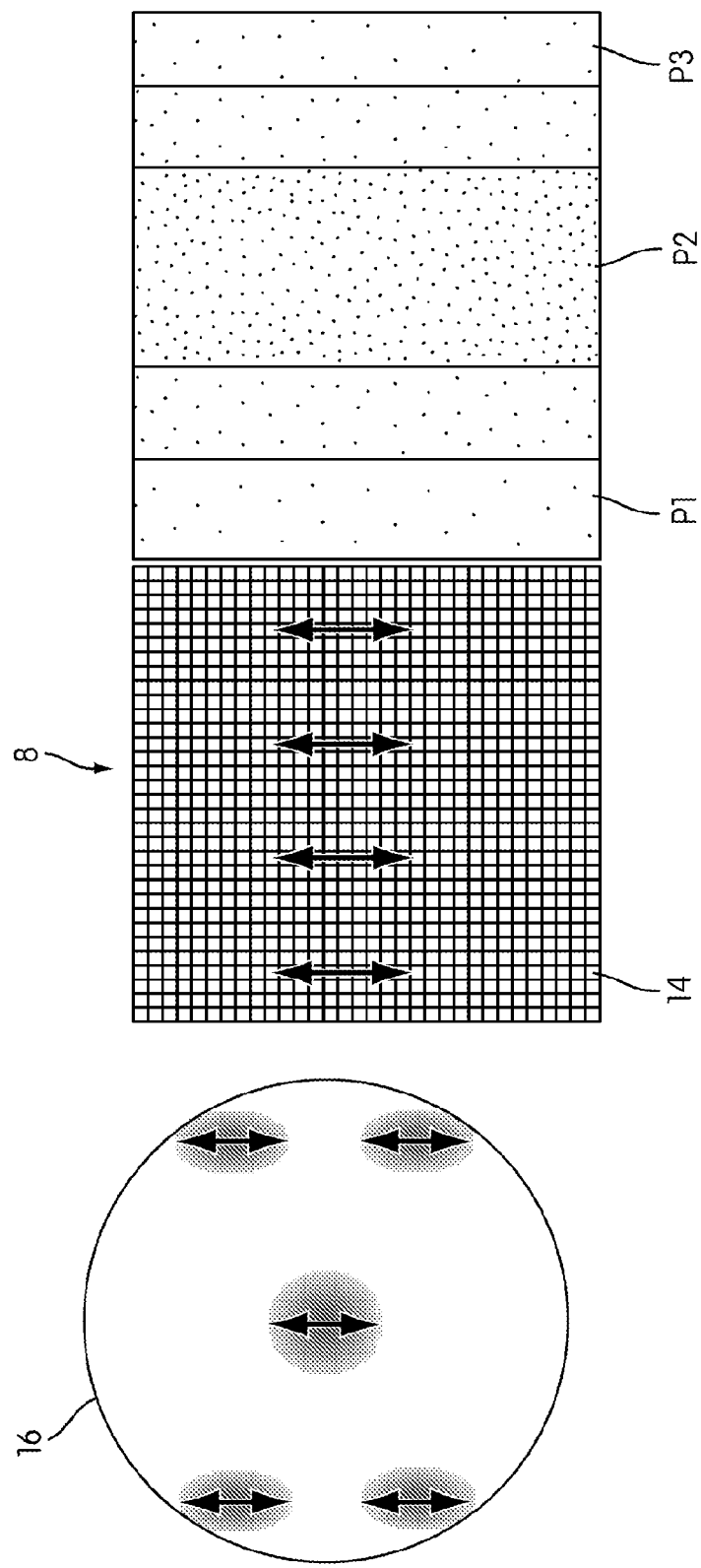

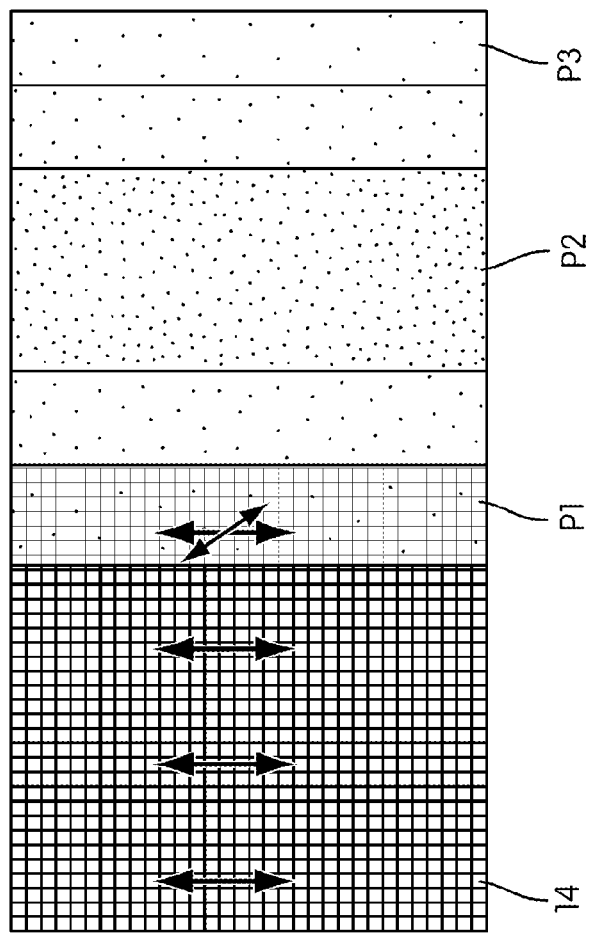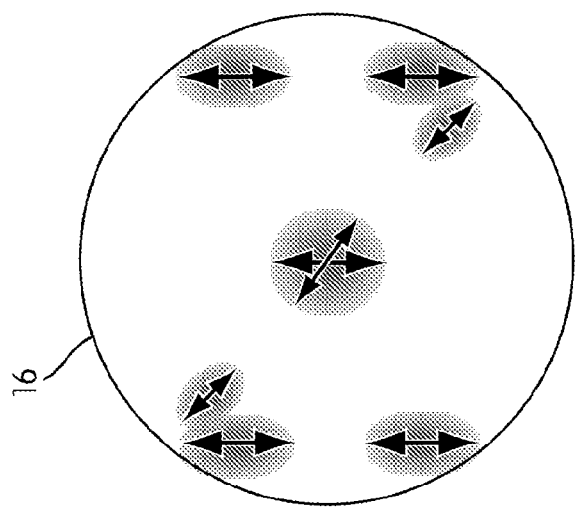
FIG. 6b

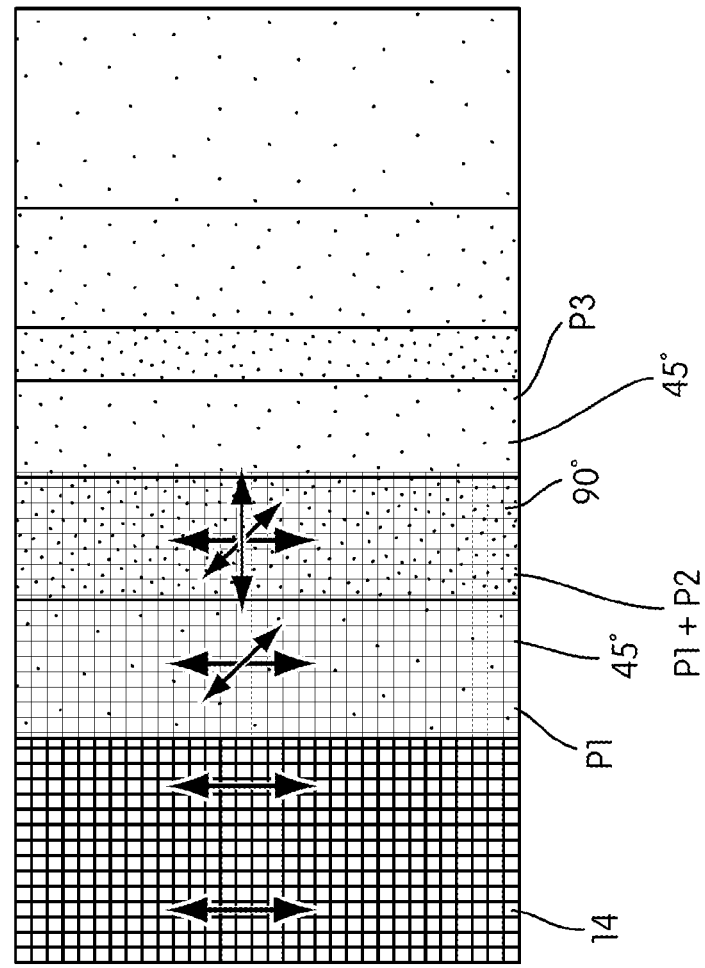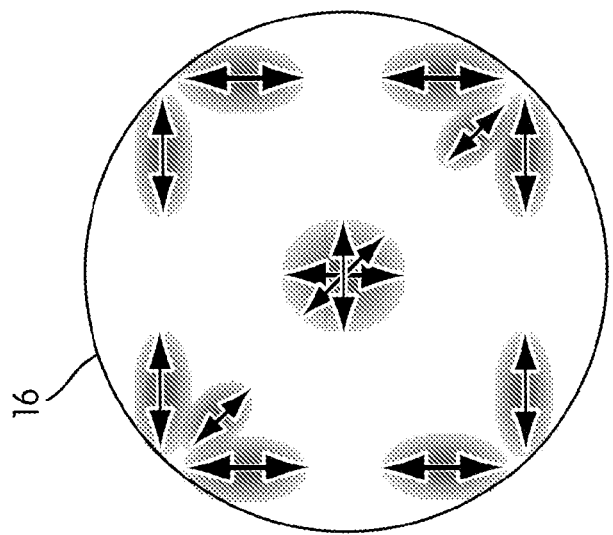
FIG. 6c

SOURCE POLARIZATION OPTIMIZATION

CROSS-REFERENCE TO RELATED APPLICATIONS

This application claims priority to U.S. Provisional Application No. 61/385,933, filed Sep. 23, 2010, the contents of which are incorporated herein by reference in its entirety.

FIELD

The present invention relates to a lithographic apparatus and an illumination system used in the lithographic apparatus.

BACKGROUND

A lithographic apparatus applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A lithographic apparatus generally includes an illumination system, referred to hereafter as an illuminator. The illuminator receives radiation from a source, for example a laser, and produces an illumination beam for illuminating a patterning device. Within a typical illuminator, the beam is shaped and controlled such that at a pupil plane the beam has a desired spatial intensity distribution, also referred to as an illumination mode. Examples of types of illumination modes are conventional, dipole, asymmetric, quadrupole, hexapole and annular illumination modes. This spatial intensity distribution at the pupil plane effectively acts as a secondary radiation source for producing the illumination beam. Following the pupil plane, the radiation is typically focused by an optical element (e.g., lens) group referred to hereafter as "coupling optics". The coupling optics couples the focused radiation into an integrator, such as a quartz rod. The function of the integrator is to improve the homogeneity of the spatial and/or angular intensity distribution of the illumination beam. The spatial intensity distribution at the pupil plane is converted to an angular intensity distribution at the object being illuminated by the coupling optics, because the pupil plane substantially coincides with the front focal plane of the coupling optics. Controlling the spatial intensity distribution at the pupil plane can be done to improve the processing latitude when an image of the illuminated object is projected onto a substrate. In particular, spatial intensity distributions with dipolar, annular or quadrupole off-axis illumination modes have been proposed to enhance the resolution and/or other parameters of the projection, such as sensitivity to projection system aberrations, exposure latitude and depth of focus.

Furthermore, the beam may be polarized. A correctly polarized beam may enhance image contrast and/or improve exposure latitude. These effects may result in an improved dimension uniformity of the imaged features. This eventually leads to an improved yield of the product.

SUMMARY

In an aspect of the present invention, a lithographic simulation process is described, where each source point in a preselected group of source points at a pupil plane of an illumination source is represented by one or more variable parameters, wherein at least some of the variable parameters characterize a polarization state at the source point One or both of the preselected group of source points in the illumination source and a representation of the design layout are iteratively reconfigured based on a computed gradient of a cost function with respect to at least some of the one or more variable parameters until a desired lithographic response is obtained, wherein the cost function comprises an aerial image intensity of a representation of the design layout projected using the preselected group of source points.

In an additional aspect of the present invention, some of the one or more variable parameters may characterize an intensity at a source point, which may be optimized as well.

In another aspect of the present invention, the one or more variable parameters are chosen to create a customizable polarization condition at a particular source point, wherein the customizable polarization condition may comprises a mix of various polarization states.

In a further aspect of the present invention, physical hardware-related restriction of possible polarization states at a particular source point is characterized in the simulation in terms of a set of constraints.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 5 shows a method for optimizing the imaging of a pattern in accordance with an embodiment of the invention;

FIGS. 6a-d show a method for creating a freeform polarization in accordance with an embodiment of the invention;

DETAILED DESCRIPTION

In this section, FIGS. 1-17 pertain primarily to optical hardware implementation of the source polarization optimization mechanism, while FIGS. 18-21 pertain primarily to source polarization optimization simulation algorithms that are integrated into the physical optical hardware. As would be appreciated by persons skilled in the art, computational lithography simulation facilitates operation of actual lithography apparatus by predicting the most effective hardware configurations without actually having to perform the lithography process.

Figure 1:
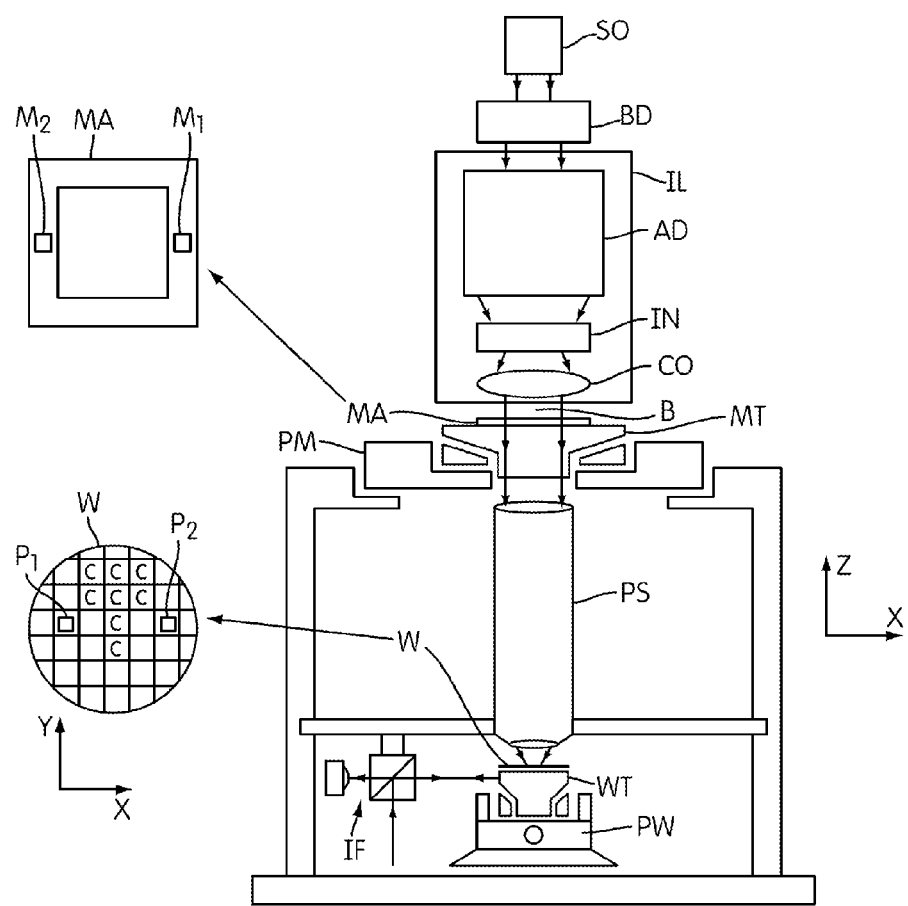
FIG. 1 shows a lithographic apparatus according to an embodiment of the invention.

FIG. 1 schematically shows a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, diffractive, magnetic, electromagnetic, electrostatic or other types of optical components, or any combination thereof, for directing, shaping, or controlling radiation.

The support structure MT holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
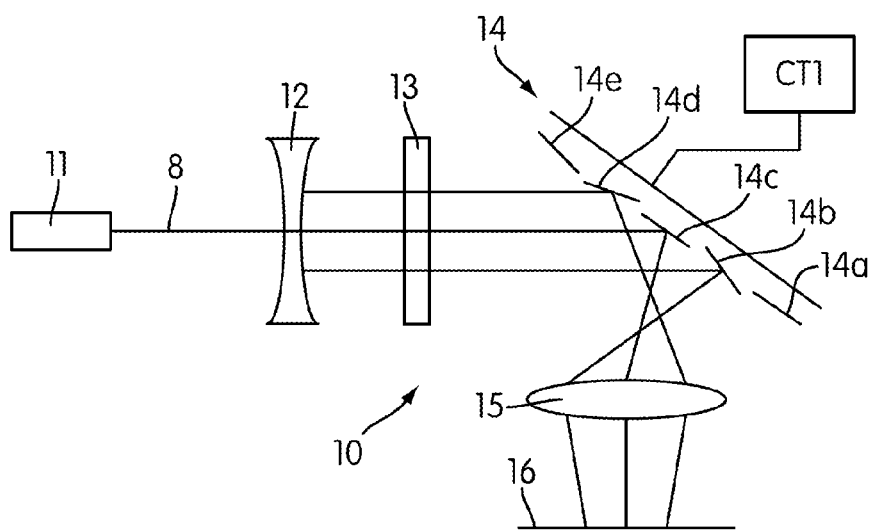
FIG. 2 shows an illumination system according to an embodiment of the invention.

FIG. 2 shows an example of an illuminator 10 connected to a radiation source 11, for example a Hg-lamp or laser or an EUV light source. The illuminator comprises in this order beam diverging optics 12, a polarization member 13, an array of reflective elements 14 and redirecting optics 15. In operation, the radiation source generates a collimated beam which is directed to the array of reflective elements 14 via the beam diverging optics 12 and the polarization member 13. The beam diverging optics expands the beam into a number of sub-beams, associating each of the sub-beams with a reflective element 14a, 14b, 14c, 14d, 14e of array 14 of reflective elements. The beam diverging optics 12 renders collimated beams. The cross-section of the expanded beam is sufficient such that the beam is incident at all or a subset of reflective elements 14a to 14e. FIG. 2 shows, by way of example, three sub-beams of the expanded beam. The beam diverging optics may additionally include a positive lens or lens array to set the divergence of the sub-beams. The polarization member 13, which polarizes the beam in a manner described further below, is located at or near a plane optically conjugate to the array of reflective elements 14.

FIG. 2 shows a first sub-beam incident at reflective element 14b. Like the other reflective elements 14a and 14c to 14e of the array 14, the reflective element 14b reflects the sub-beam to an intermediate plane 16 via re-directing optics 15. The reflective elements 14a-e of the array 14 are controlled by a controller CT1. The re-directing optics 15, for example a focusing lens, directs the sub-beam to a desired area in the intermediate plane 16 of the illuminator. The intermediate plane 16 may coincide with the pupil plane which acts as a secondary radiation source (as described above). Furthermore, the reflective elements 14c, 14d reflect the other two sub-beams shown to other areas of the intermediate plane 16 via the re-directing optics 15. By adjusting the orientations of the reflective elements 14a to 14e and thus determining the areas of the intermediate plane 16 on which the sub-beams are incident, almost any spatial intensity distribution in the intermediate plane 16 can be produced.

Although the array of reflective elements 14 is shown in FIG. 2 as five reflective elements 14a-e, in practice a significantly larger number of reflective elements may be provided in the array. The array may, for example, comprise a two-dimensional array. The array may, for example, comprise 100 reflective elements or more. In one embodiment, the array may include more than 1000 reflective elements.

Figure 3A:
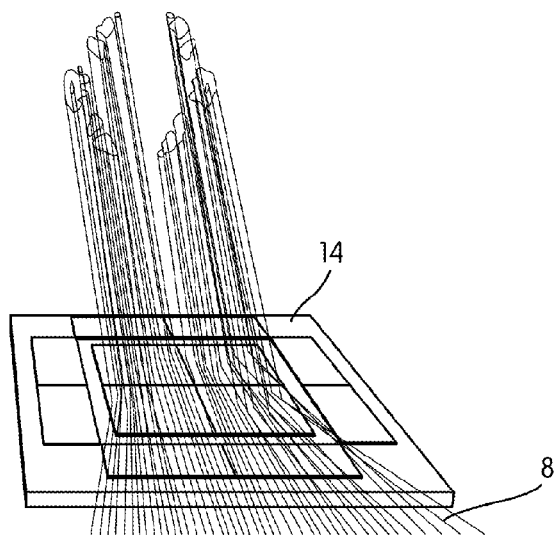
FIGS. 3a, b show an array of reflective elements in accordance with an embodiment of the invention.
Figure 3B:
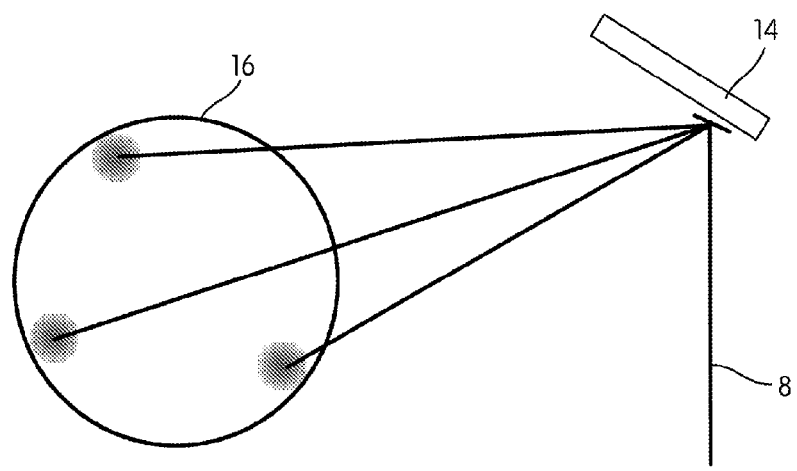

Referring to FIGS. 3a-b, these figures show an array 14 of reflective elements in accordance with an embodiment of the invention. The array 14 of reflective elements includes a plurality of reflective elements (over 1000) or mirrors that are configured to reflect the incident beam of radiation 8 to various desired areas in the pupil plane 16. In one embodiment, each reflective element or mirror of the array 14 is adapted to direct the incident beam of radiation 8 to any position in the pupil plane 16.

Figure 4:
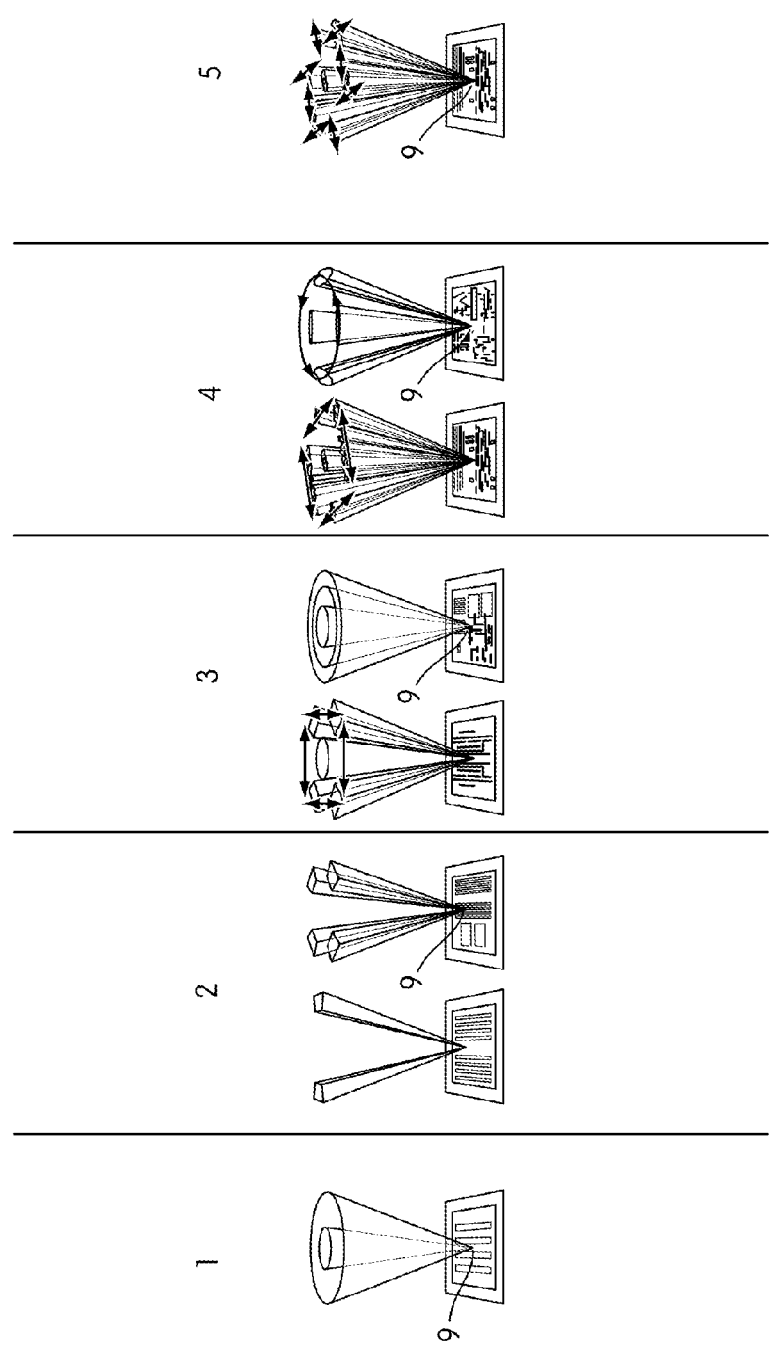
FIG. 4 shows various approaches for optimizing the imaging of a selected pattern.

Referring to FIG. 4, this figure shows various approaches for optimizing the imaging of a selected mask pattern 9. Approach one consists of optimizing the printing of the selected pattern 9 with a conventional and annular illumination. Approach one was developed in the early 1990's. Approach 2 consists of optimizing the printing of a pattern 9 with a dipole or quadrupole illumination. The dipole or quadrupole illumination can be generated with diffractive optical elements (DOE). Approach 3 consists of optimizing the printing of the selected pattern 9 with 6 or more poles and/or with soft poles (i.e. poles having reduced intensities) and/or with multiple ring illumination. The optimization approach 3 can also use X, Y and/or X/Y polarization. The X, Y and/or X/Y polarization can be provided by various polarization wave plates located in the illumination system. The illumination in approach 3 can be generated with diffractive optical elements. Approach 4 consists of optimizing the printing of a pattern 9 with the array of reflective elements 14 shown in FIG. 2 and X, Y, X/Y, TE and/or TM polarization with a flexible illuminator. The illuminator of approach 4 can provide free-form illumination shapes. In approaches 3 and 4, a separate polarization wave plate is required to create the desired X, Y, X/Y polarization or the TE or TM polarization. That is, in approach 4, if one wants to change the polarization from X, Y, X/Y to a TE or TM polarization, a new plate must be inserted in the illumination system, which is undesirable.

Additional information regarding the use of diffractive optical elements or reflective elements to create illumination shapes in the pupil plane of the illuminator can be gleaned from U.S. Pat. Nos. 7,015,491, 6,737,662, 7,525,642 and U.S. Publication No. 2009-0174877, the contents of which are incorporated herein in their entireties by reference.

In accordance with an embodiment of the invention, approach 5 consists of using the flexible illumination (using a flexible illuminator to provide free-form illumination shapes) of FIG. 2 and a freeform type of polarization in order to create any desired polarization (X, Y, X/Y, TE and/or TM) at any location within the pupil plane 16 of the illumination system (see FIG. 5—showing a programmable polarization scheme). The freeform type of polarization can be referred to as a programmable polarization. The benefit of using unpolarization, Y, X, X/Y, TE and TM polarization, or any combination thereof, is that these modes can be available on one lithographic system. However, this might create backward compatibility and flexibility. The benefit of using a freeform polarization is that an enhanced imaging with more advanced polarization can be created.

Figure 6D:
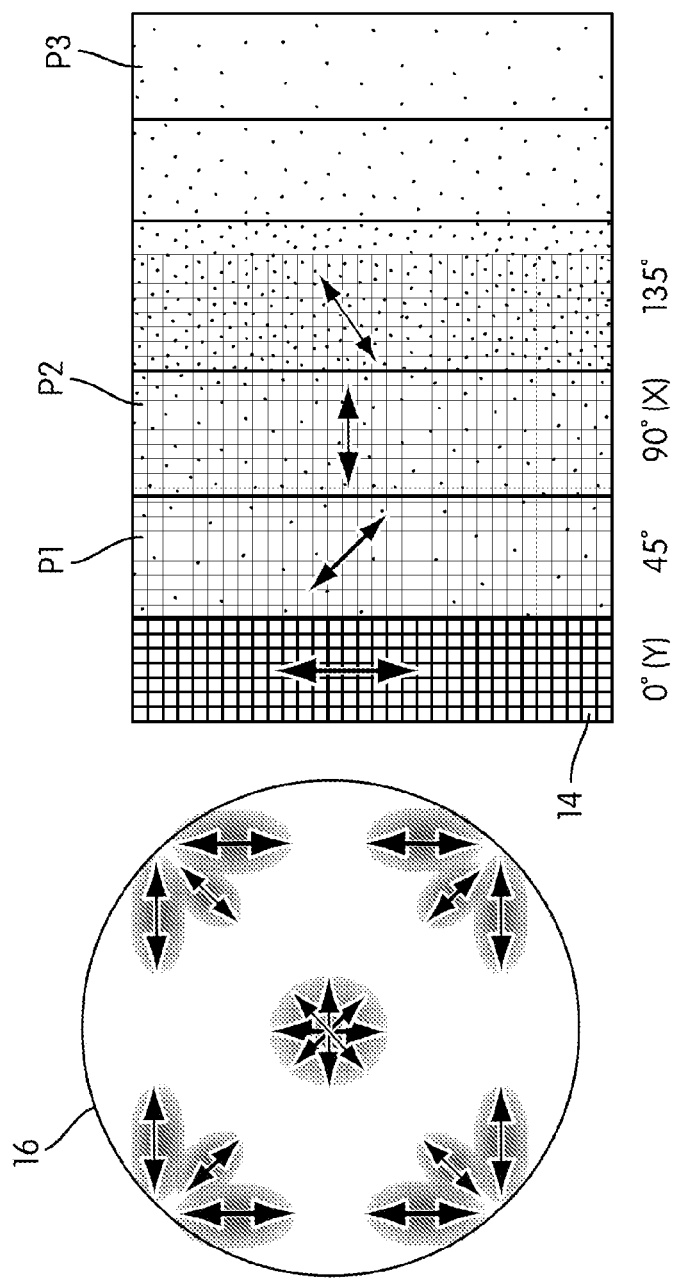

Referring now to FIGS. 6a-d, these figures show a method for creating a freeform polarization in accordance with an embodiment of the invention. The freeform polarization is obtained by changing the polarization of selected portions of the incident beam 8 so that the reflective elements of the array 14 will reflect beams having different polarizations. The change of polarization is effected with three different 45° polarized wave plates 1-3. For example, referring to FIG. 6a, this figure shows the incoming radiation 8 having a Y polarization. If the polarization of the incoming radiation beam 8 is not changed, the illumination pattern created in the pupil plane 16 will be Y polarized. By contrast, as shown in FIG. 6b, if a first wave plate 1 is inserted into a portion of the incoming radiation 8, that portion of the incoming radiation beam 8 will have its polarization changed from Y to X/Y (45°). As a result, part of the reflective elements of the array 14 will be able to reflect a X/Y polarized beam anywhere within the pupil plane 16 of the illumination. FIG. 6c and FIG. 6d show how X and 135° polarizations can be obtained by superposing the plates 1-3 in the remaining portions of the incident beam 8. The wave plates 1-3 can be movable or fixed as will be described hereinafter in more detail. It will be apparent to the person skilled in the art that using different or more polarization changing plates, more polarization states may be generated without departing from the scope of the invention.

Figure 7:
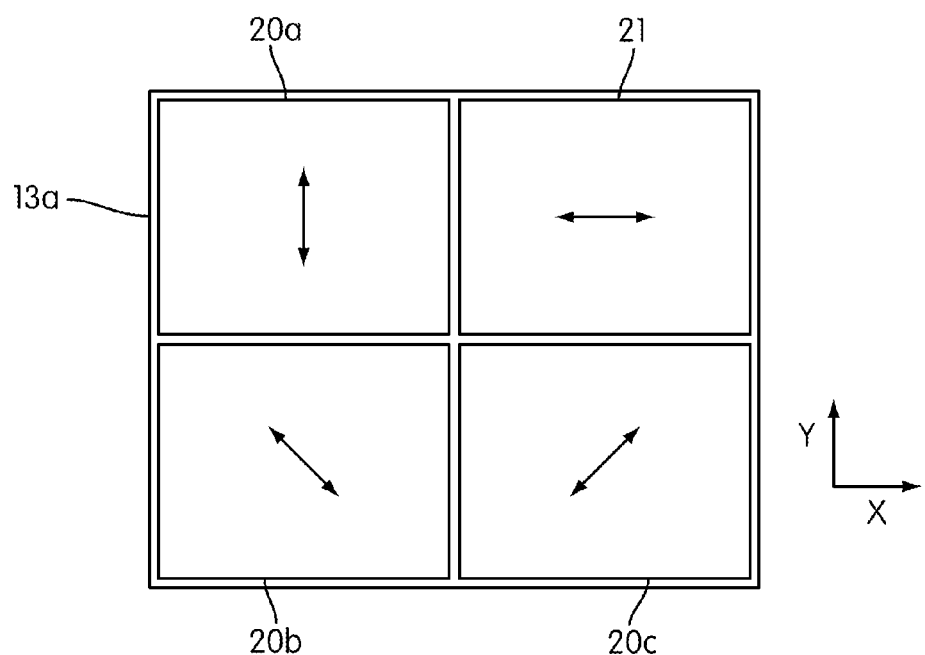
FIGS. 7-8 show a polarization member which may form part of the illumination system.
Figure 8:
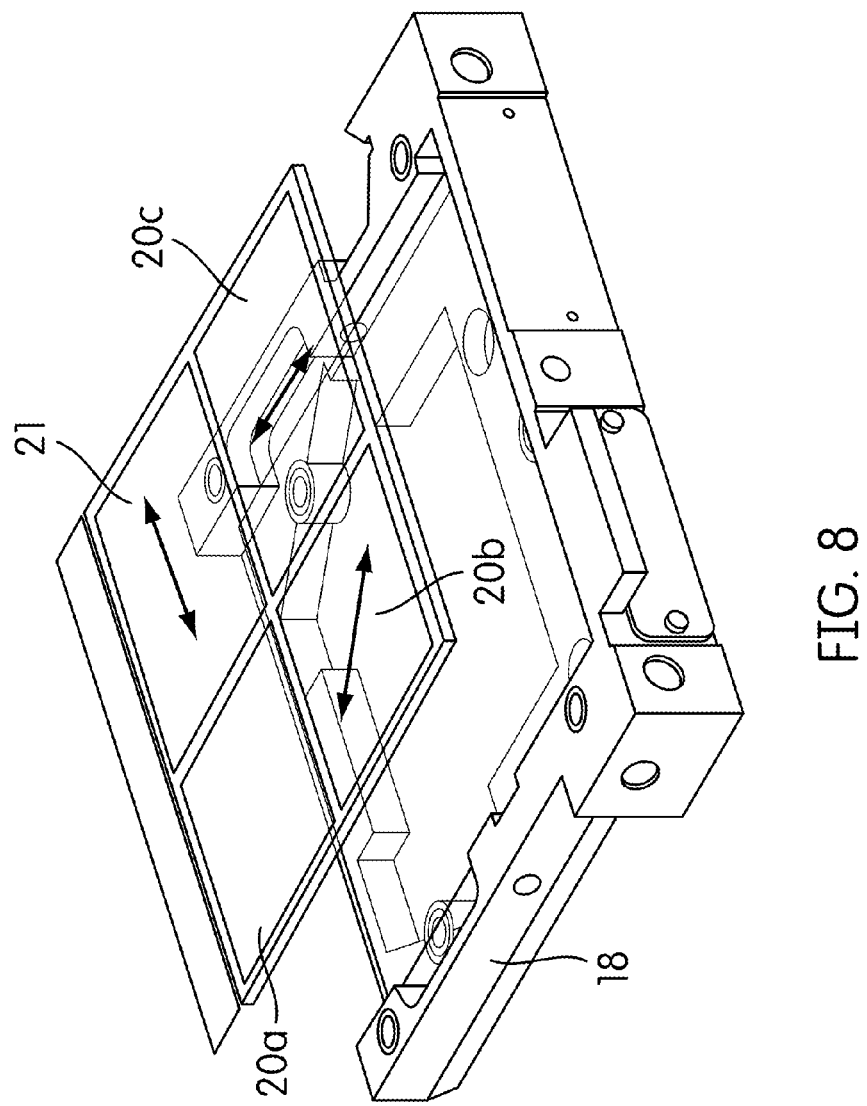

FIGS. 7 and 8 show schematically viewed from one side a different embodiment 13a of the polarization member 13. The polarization member comprises three wave plates 20a-c and a window 21 arranged on a frame 18 and fixed with respect to the mirror array 14. Each of the wave plates 20a-c is configured to apply a different polarization to the radiation beam 8 delivered from the radiation source 11. In this embodiment, the radiation beam delivered from the radiation source is linearly polarized in the x-direction (in this example TE polarization). This polarization is represented schematically by a horizontal double headed arrow in the window 21. The first wave plate 20a is configured to rotate the polarization of the radiation beam through 90°, such that the radiation beam is then polarized in the y-direction (in this example TM polarization). This is represented schematically by the vertical double headed arrow in the first waveplate 20a. The second waveplate 20b is configured to rotate the polarization of the radiation beam such that it lies in the plane x=−y. This is indicated schematically by the back-sloping double headed arrow in the second wave plate 20b. The third wave plate 20c is configured to rotate the polarization of the radiation beam such that it lies in the plane x=y. This is shown schematically by the forward sloping double headed arrow in the third wave plate 20c.

In use, a pattern being projected from the patterning device MA onto the substrate W by the lithographic apparatus (see FIG. 1) may be projected using radiation which is polarized in the x-direction. Where this is the case, the controller CT1 may control the orientations of the reflective elements 14a-e such that only reflective elements which have received radiation that passed through the window 21 are used to form the illumination mode used by the lithographic apparatus. Radiation incident upon the reflective elements 14a-e which has passed through the wave plates 20a-c may, for example, be directed by the reflective elements 14a-e towards a beam dump, or towards another location which does not contribute to the illumination mode. Thus, an embodiment of the invention allows selection, via the controller CT1, of only x-polarized radiation in the illumination system of the lithographic apparatus.

If the pattern to be projected from the patterning device MA onto the substrate W would be better projected using radiation polarized in the y-direction, then the controller CT1 may control the reflective elements 14a-e of the reflective elements array 14 such that only radiation which has passed through the first wave plate 20a is used to form the illumination mode. Similarly, if the pattern is such that radiation polarized in the plane x=−y would provide better imaging, then the controller CT1 may control the reflective elements 14a-e such that only radiation which has passed through the second wave plate 20b is used to form the illumination mode.

Similarly, if the pattern is such that radiation polarized in the plane x=y would provide better imaging, then the controller CT1 may control the reflective elements 14a-e such that only radiation which has passed through the second wave plate 20C is used to form the illumination mode.

In some instances it may be desired to use a radiation beam which does not have one of the four polarizations shown in FIG. 7. Where this is the case, radiation which has passed through more than one wave plate 20a-c, or radiation which has passed through the window 21 and one or more wave plates 20a-c, may be used to obtain the desired polarization. For example, radiation which has passed through the window 21 and radiation which has passed through the third wave plate 20c may be used to form the illumination mode. The radiation will in this instance have a polarization which has an angle of approximately 22.5° from the x-direction. In a further example, radiation which has passed through the first and third wave plates 20a,c may be used to form the illumination mode. In this instance, the radiation may have a polarization which forms an angle of approximately 22.5° relative to the y-direction.

In some instances it may be desired to use radiation which is not polarized, or which approximates radiation which is not polarized. Where this is the case, radiation which has passed through the window 21 and the first wave plate 20a may be used. Alternatively radiation which has passed through the second and third wave plates 20b,c may be used. In a further alternative, radiation which has passed through all three wave plates 20a-c and through the window 21 may be used.

The window 21 may have the same optical path length as the wave plates 20a-c in order to provide consistency of optical path length traveled by the radiation beam in the illumination system.

The polarization member 13a may be used to apply any polarization to the radiation beam which is a combination of the four polarizations shown in FIG. 7 (i.e. x-direction, y-direction, x=−y plane and x=y plane). If it is desired to provide radiation with a polarization which cannot be formed from a simple combination of the polarizations shown in FIG. 7, then a modified approach may be used. The modified approach comprises directing different intensities of radiation through different wave plates 20a-c and/or through the window 21. For example, a radiation beam may be formed using the polarization member and the reflective elements by directing all of the radiation which passed through the window 21 into the illumination mode and passing only half of the radiation which passed through the third wave plate 20c into the illumination mode. This will provide a polarization which is approximately 12° from the x-direction. Other combinations of intensities may be used to obtain other polarizations. As will be appreciated by one skilled in the art, other combinations of reflected beams of radiation may be used to obtain other polarizations (e.g. combining 4 beams of radiation polarized by the wave plate 20a and 2 beams of radiation polarized by the wave plate 20b).

A polarization member 13b according to a further embodiment of the invention is shown schematically in FIG. 9. The polarization member comprises a first wave plate 30a, a second wave plate 30b and a third wave plate 30c. Each wave plate is connected to a window 31a-c. Each window is connected to an actuator 32a-c which is operated by a controller CT2.

The controller CT2 may be used to move each of the actuators 32a-c independently, such that the radiation beam (indicated by a hollow arrow) passes through one or more of the wave plates 30a-c, or passes through none of the wave plates. When the radiation beam does not pass through a wave plate it instead passes through the window 31a-c associated with that wave plate 30a-c, thereby providing consistency of the path length traveled by the radiation beam.

Figure 9A:
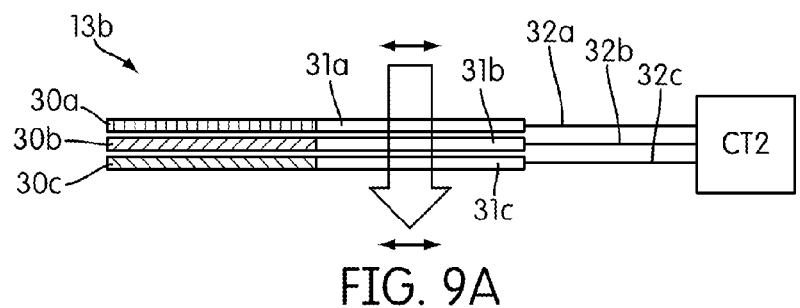
FIGS. 9A-D show a further polarization member which may form part of the illumination system.

Referring to FIG. 9A, the actuator 32a-c may be positioned such that the radiation beam passes through windows 31a-c and does not pass through any wave plates 30a-c. In this instance, the polarization of the radiation beam is unchanged. This is indicated by the double headed arrows which show the radiation beam as being polarized in the x-direction prior to passing through the windows, and which show the radiation beam being polarized in the x-direction after having passed through the windows.

Figure 9B:
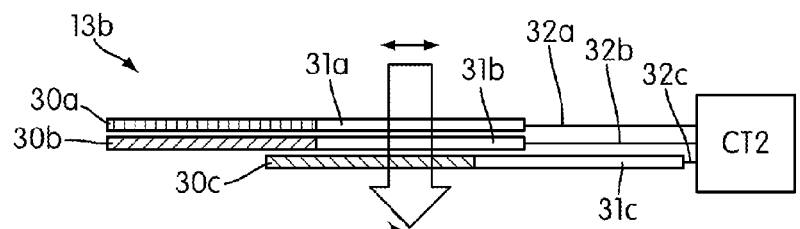

In FIG. 9B the actuators have been arranged such that the radiation beam passes through two windows 31a,b and passes through the third wave plate 30c. As is indicated by the double headed arrows, this causes the polarization of the radiation beam to change from the x-direction to be in the x=−y plane.

Figure 9C:
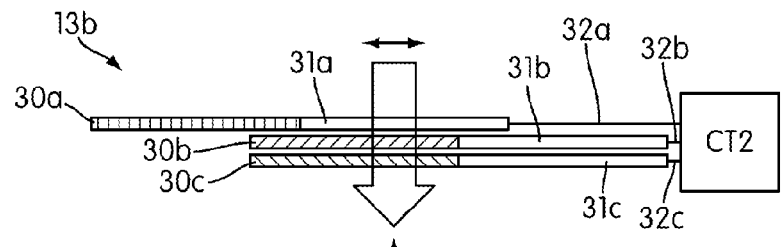

In FIG. 9C the actuators have been arranged such that the radiation passes through one window 31a, and passes through the second and third wave plates 30b,c. As shown by the double headed arrows, this causes the polarization of the radiation beam to change from the x-direction to be in the y-direction.

Figure 9D:
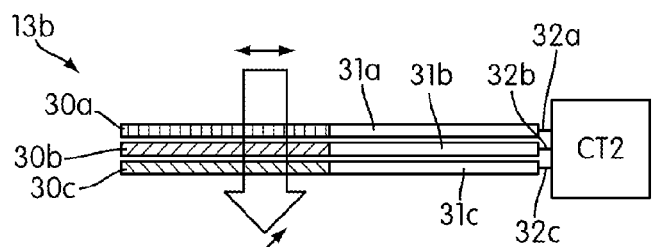

In FIG. 9D the actuators have been positioned such that the radiation beam passes through the first, second and third wave plates 30a-c. As is shown in FIG. 4B, this causes the polarization of the radiation beam to change from the x-direction to polarization which lies in the plane x=y.

Co-owned U.S. Provisional Patent Application No. 61/316,114, filed on Mar. 22, 2010, further describes the configurations of FIGS. 8 and 9A-9D, and is incorporated herein by reference.

As may be surmised from FIG. 9, each of the wave plates 30a-c has the effect of rotating the polarization of the radiation beam through 45°. Thus, when only one wave plate is used, the polarization is rotated by 45°, when two wave plates are used the polarization is rotated by 90°, and when three wave plates are used the polarization is rotated by 135°.

The polarization member 13b shown in FIG. 9 allows the polarization of the radiation beam to be controlled without significant loss of intensity from the radiation beam.

Although the polarization member 13 is shown in FIG. 2 as being located between the beam diverging optics 12 and the array of reflective elements 14, it may be provided in a suitable location. The embodiment of the polarization member 13b shown in FIG. 4 may comprise wave plates provided at different locations in the illumination system (it is not necessary for the wave plates to be located adjacent to one another).

In the above embodiments, the beam of radiation emitted from the source 11 was polarized, and the polarization was modified using the polarization member 13 comprising one or more wave plates. In some instances, the beam of radiation emitted from the source 11 may be unpolarized. Where this is the case, the wave plates shown in FIG. 3 may be replaced with polarizers, each polarizer configured to apply a different polarization. For example, the polarizations may correspond to the directions of the double headed arrows shown in FIG. 3.

Figure 10:
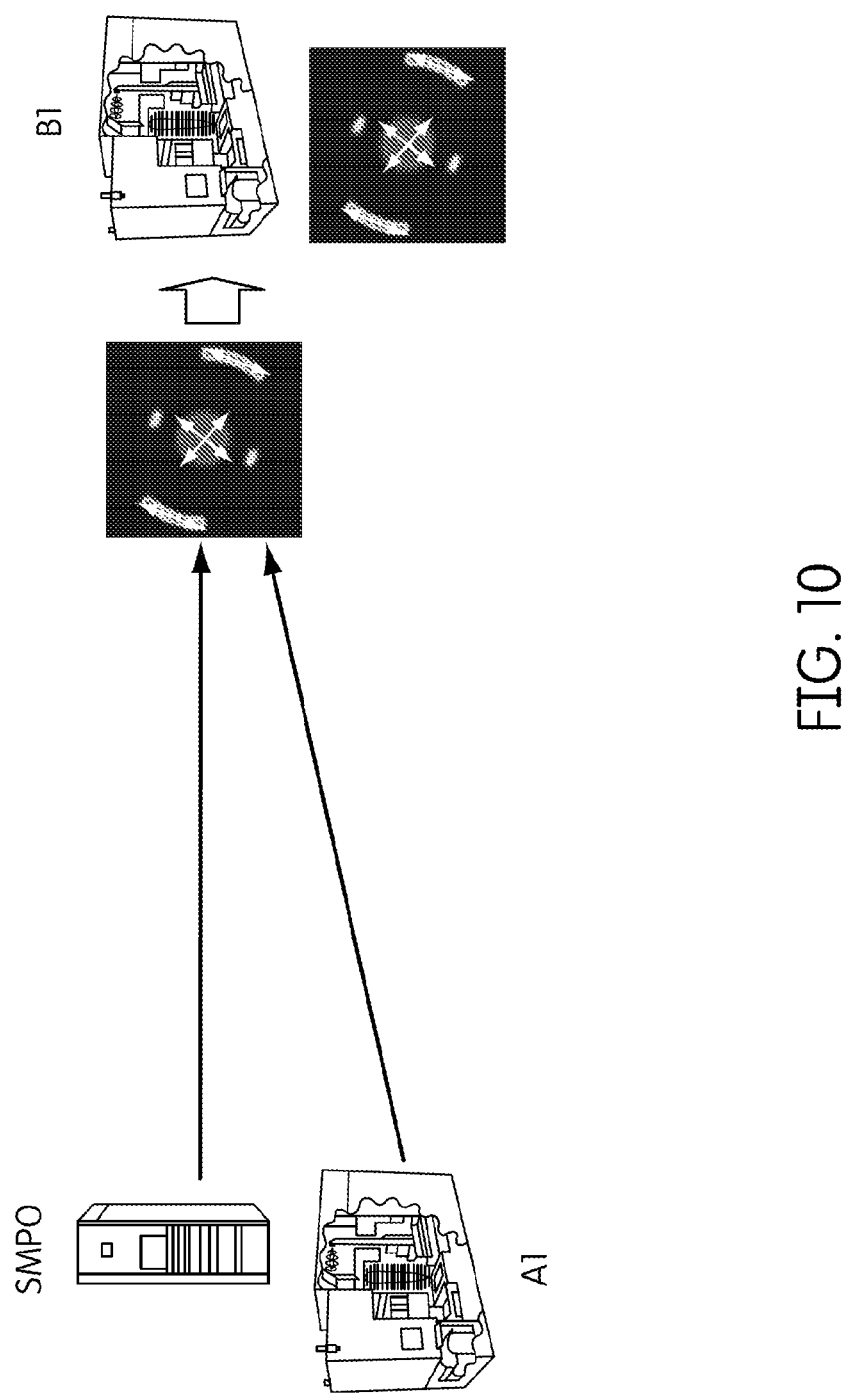
FIG. 10 shows a method for creating and maintaining optimized pupils (using a source mask polarization optimization (SMPO)) in accordance with an embodiment of the invention.

Referring now to FIG. 10, in one embodiment, a target polarized pupil is obtained by optimizing an existing (measured pupil) pupil with a source mask polarization optimization method (SMPO). A new pupil can be calibrated using the SMPO method in about 10 minutes and each new calibrated polarized pupil can be stored in a memory of the lithographic apparatus to create a library of calibrated polarized pupils. Each calibrated polarized pupil that is stored in the library can be re-loaded almost instantly by the user of the lithographic apparatus to create the desired polarization shape (X, Y, XY, TE, TM, or freeform) in the pupil plane 16. In addition, in an embodiment, any desired intensity ratio can be achieved for any polarization shape in order to obtain maximum productivity.

Further, in an embodiment, the user interface of the lithographic apparatus is adapted to include freeform polarization. In one embodiment, the freeform polarization provided by the user interface is selectable for each mask layer. In one embodiment of the invention, pupil quality is assured during production by closed-loop control of each mirror of the array 14 and closed loop control of the polarizer wave plates (plates 1-3 in FIGS. 6a-d and wave plates 20a-c in FIGS. 7 and 8).

Figure 11:
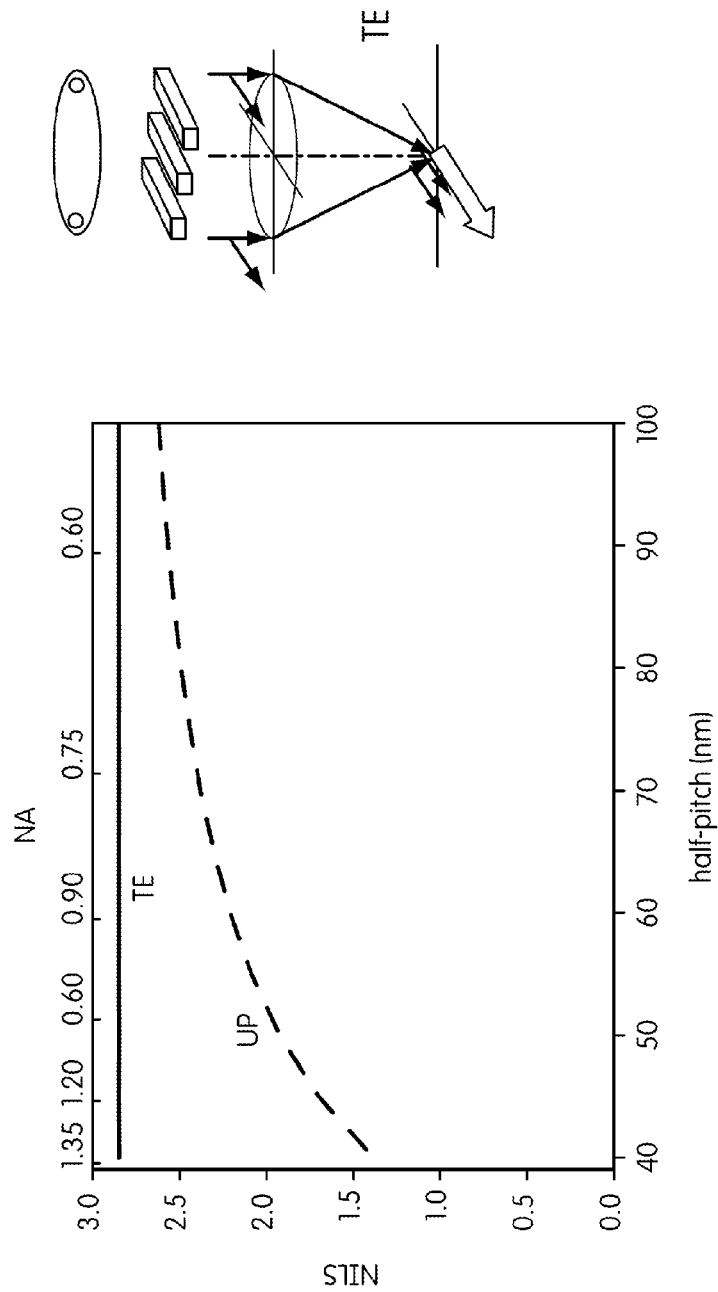
FIG. 11 shows the image contrast (as measured by NILS) as a function of the half pitch distance of an array of lines illuminated with a TE polarized beam and an unpolarized beam.

Referring to FIG. 11, this figure shows the image contrast (as measured by NILS) as a function of the half pitch distance of an array of lines illuminated with a TE polarized beam and an unpolarized beam. The array of lines (1:1 arrangement: line spacing=line width) is illuminated with a dipole (0.9σ) at 193 nm with a binary mask (BIM) without any bias and an optimized numerical aperture (NA). The film refractive index (RI) is 1.7. As can be seen in FIG. 11, the polarization benefits increase as the numerical aperture (NA) of the illumination system increases (and k1 is reduced).

Figure 13A:
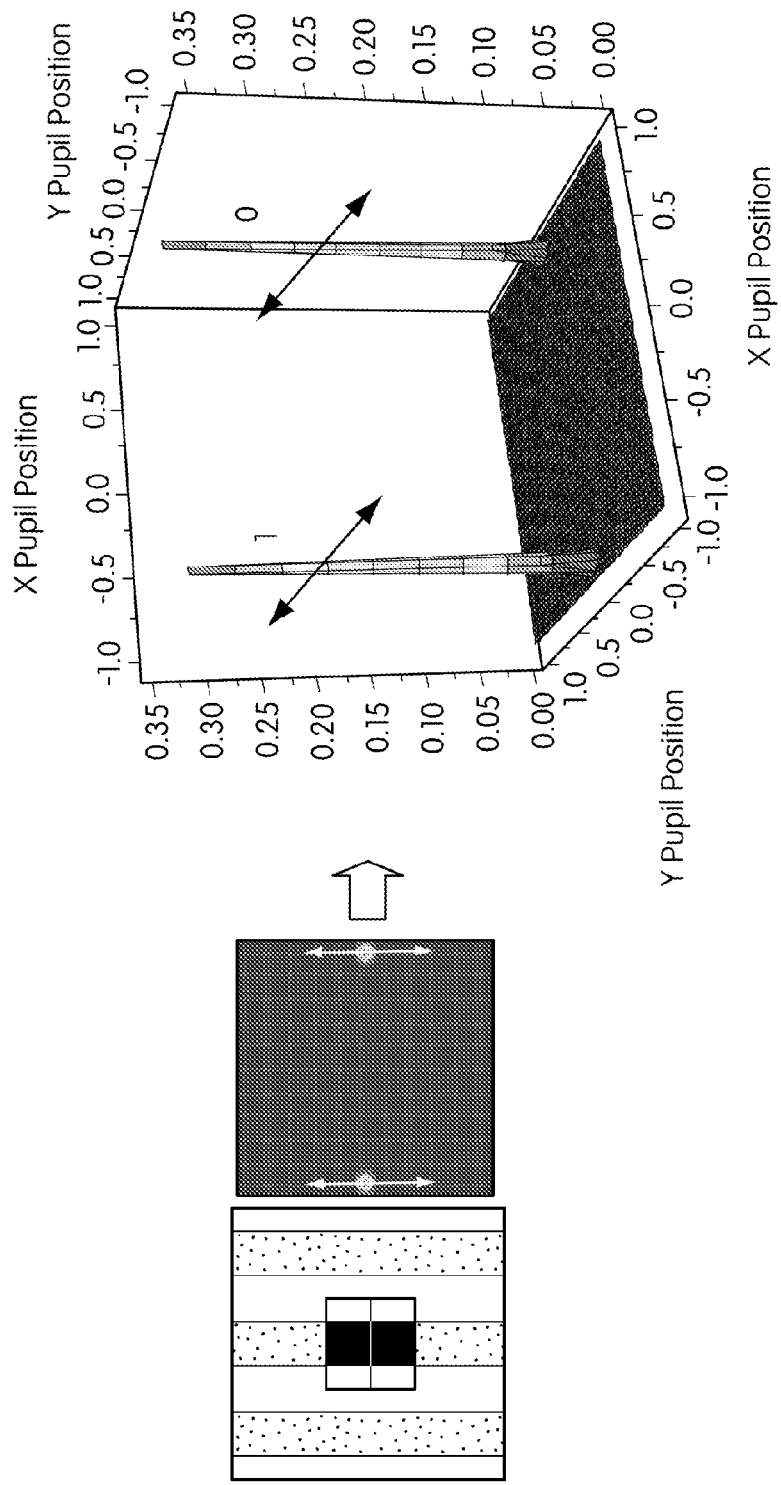
FIGS. 13*a-b* show that optimal polarization can be determined based on diffraction patterns.

FIG. 13a shows that optimal polarization can be determined based on diffraction patterns. For example, in order to optimize the printing of the dense line array of FIG. 11, it is desirable to use the 0 and $1^{st}$ diffraction orders and the best results are obtained when the polarization vectors of the 0 and $1^{st}$ diffraction orders are aligned. This corresponds to the TE polarization. In FIG. 13a, the pattern is a dense line array (1:1), illuminated with a dipole and a binary mask (BIM), with k1=0.28.

Figure 12:
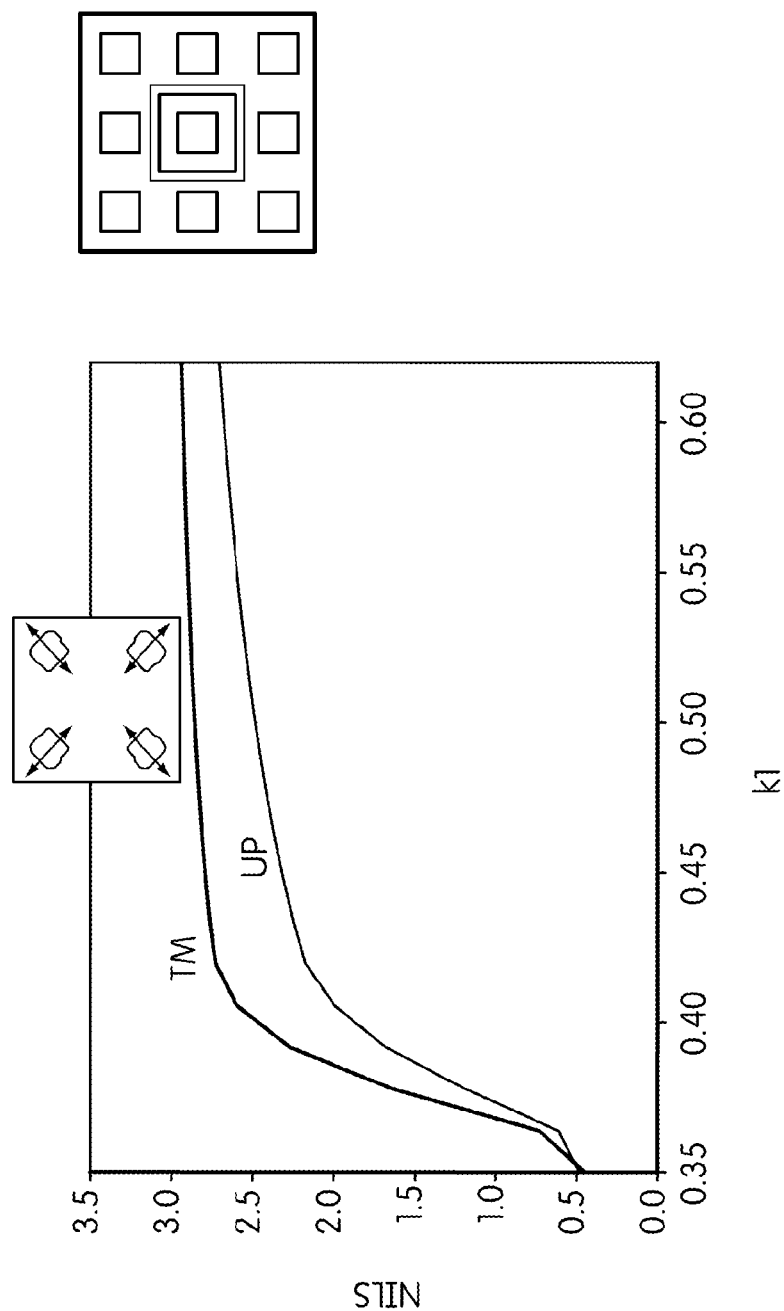
FIG. 12 shows the image contrast (as measured by NILS) as a function of k1 for an array of holes illuminated with a TM polarized beam and an unpolarized beam.

Referring to FIG. 12, this figure shows the image contrast (as measured by NILS) as a function of k1 for an array of holes (1:1 arrangement: hole spacing=hole diameter) illuminated with a TM polarized beam and an unpolarized beam at 193 nm with a 1.35 NA and a 6% attenuated phase shift mask without bias. The film refractive index (RI) is 1.7. The array of holes is illuminated with a quadrupole with k1>0.36 and an attenuated phase shift mask. As can be seen in FIG. 12, dense hole arrays can be printed with higher latitude using a TM polarized beam. Additional information about the benefits of using TM polarization to print dense hole arrays can be gleaned from the article by N. Baba-Ali, H. Sewell, J. Kreuzer (ASML) Proc. SPIE 5040, 1352 (2003), which is incorporated herein in its entirety by reference.

Figure 13B:
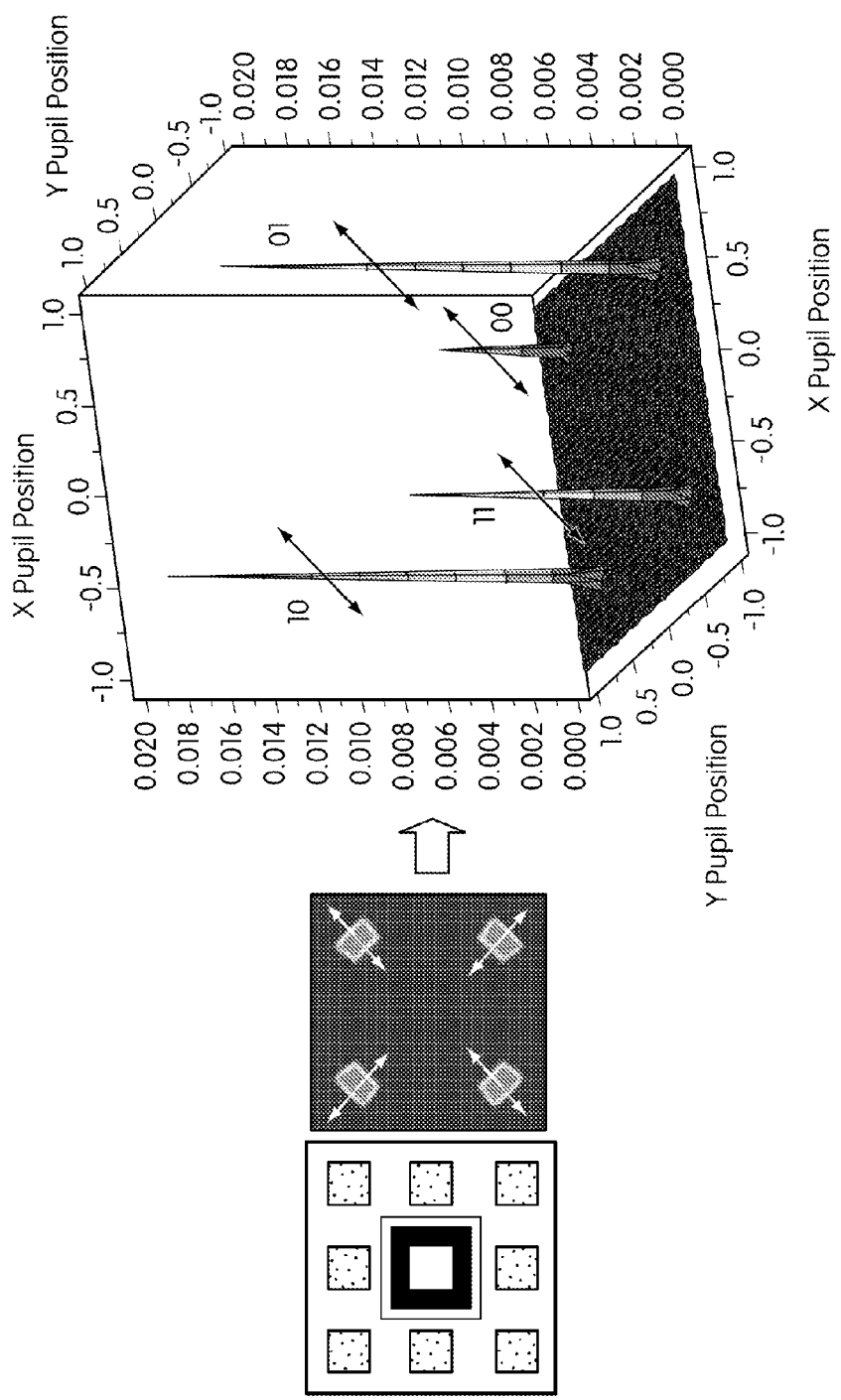

FIG. 13b shows that optimal polarization can be determined based on diffraction patterns. For example, in order to optimize the printing of the dense line array of FIG. 12, it is desirable to use the "01" and "10" diffraction orders ($1^{st}$ diffraction orders) because the "00" order is weak and imaging is dominated by higher diffraction orders. The best results are obtained when the polarization vectors of the "01" and "10" diffraction orders are aligned. This corresponds to the TM polarization.

Figure 14:
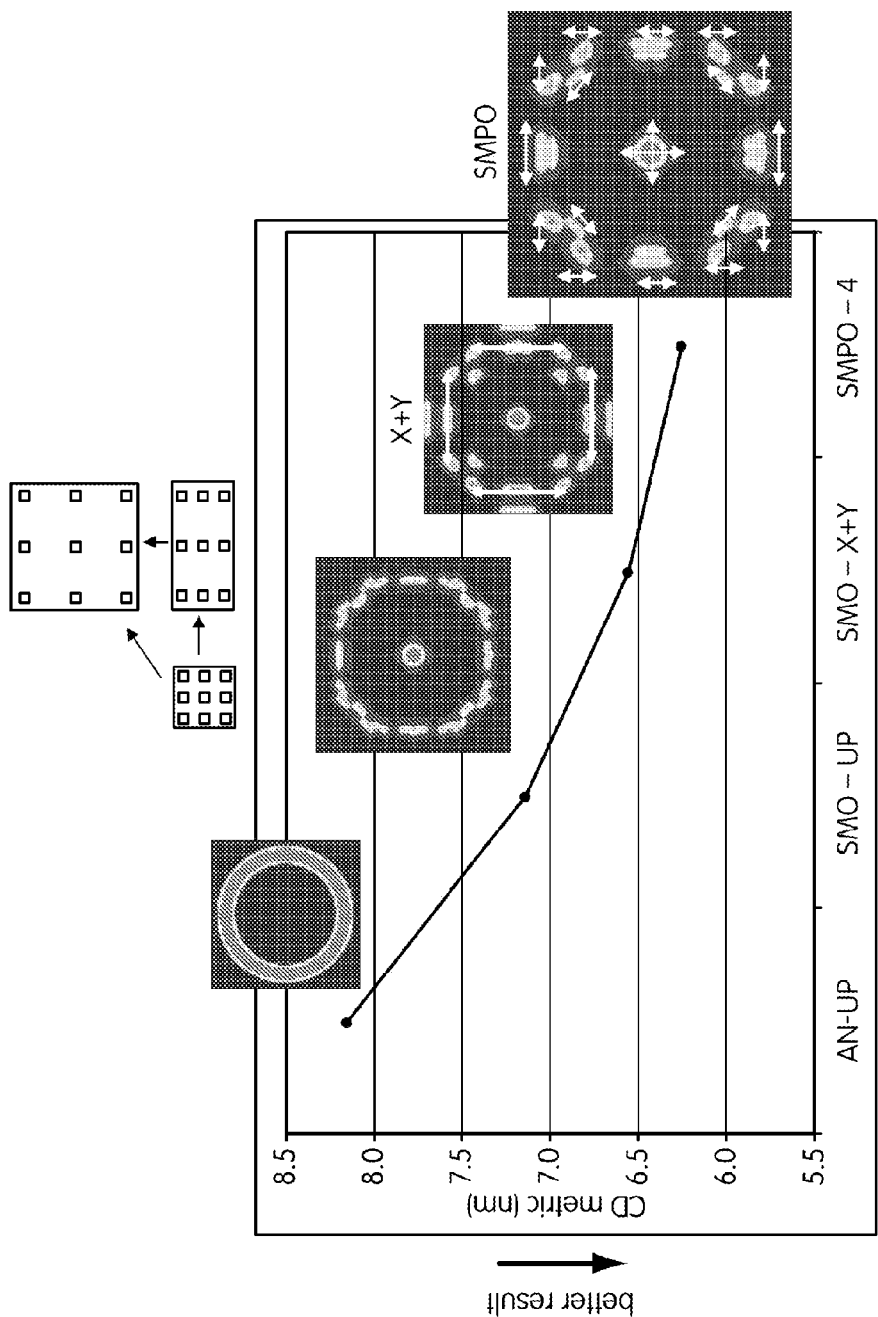
FIG. 14 shows the critical dimension (CD) variations for a grid of 50 nm rectangular holes arranged in various pitches.

FIG. 14 shows the critical dimension (CD) variations for a grid of 50 nm holes arranged in various two-dimensional rectangular arrays. The CD variations of FIG. 14 are obtained with different optimization methods. The pitches of the grids are varied in the X and Y directions (X/Y) (e.g. 95/95, 100/100, 110/110, 110/130, 110/150, 110/170, 110/190, 130/130, 130/150, 130/170, 130/190, 150/150, 150/170, 150/190, 170/170, 170/190, 190/190 nm pitch Manhattan (i.e. a grid array of holes) printed at 50 nm target). As can be seen in FIG. 14, CD variations greater than 8 nm are obtained when using a conventional annular illumination without further optimization. Those CD variations can be reduced by about 12% when using a source optimization. The CD variations can be further reduced by about 8% by changing the polarization (e.g. X/Y polarization) in the pupil plane of the illumination system. Finally, the CD variations can be reduced even further (by about 4%) when using a freeform polarization in the pupil plane of the illumination system. As explained above and shown in FIG. 14, when using freeform polarization, various locations of the pupil planes have different polarizations. It is envisioned that freeform polarization optimization can reduce CD variations even further for other types of patterns.

Figure 18:
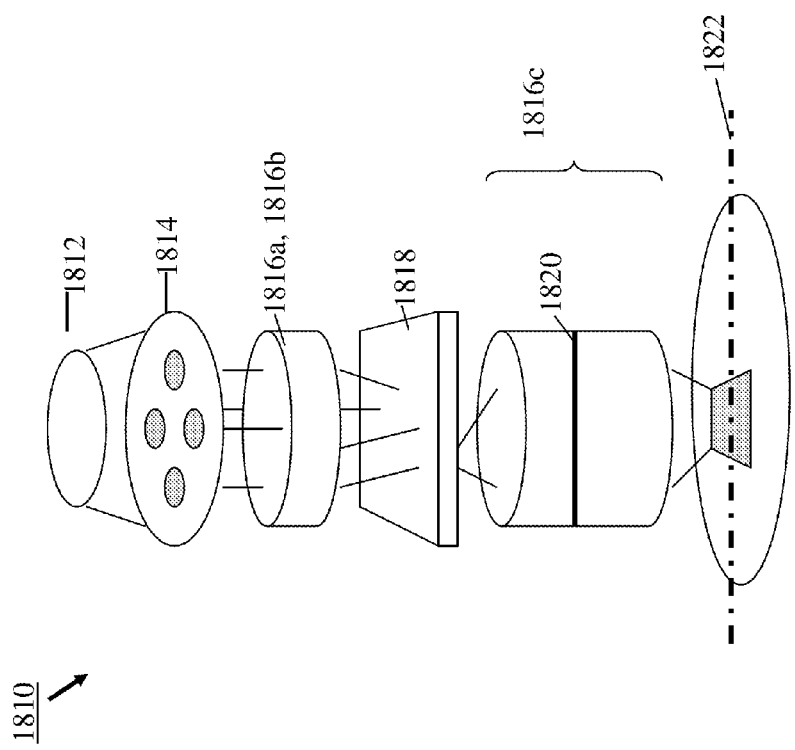
FIG. 18 illustrates an exemplary lithographic projection system, where the source polarization optimization methods of the present invention are implemented.
Figure 19:
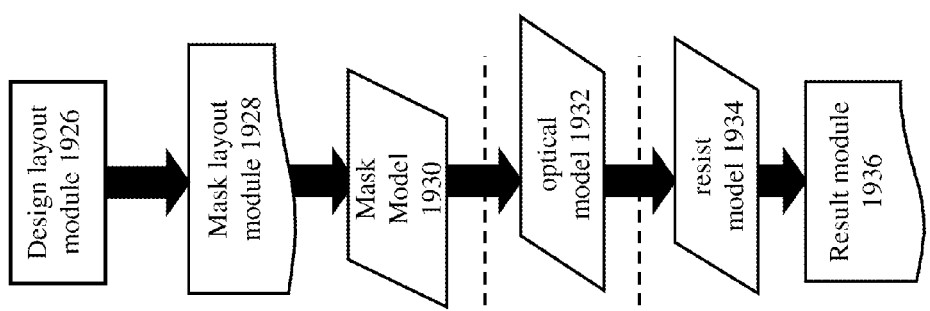
FIG. 19 illustrates various functional modules of a lithographic simulation model, according to an embodiment of the preset invention.
Figure 20:
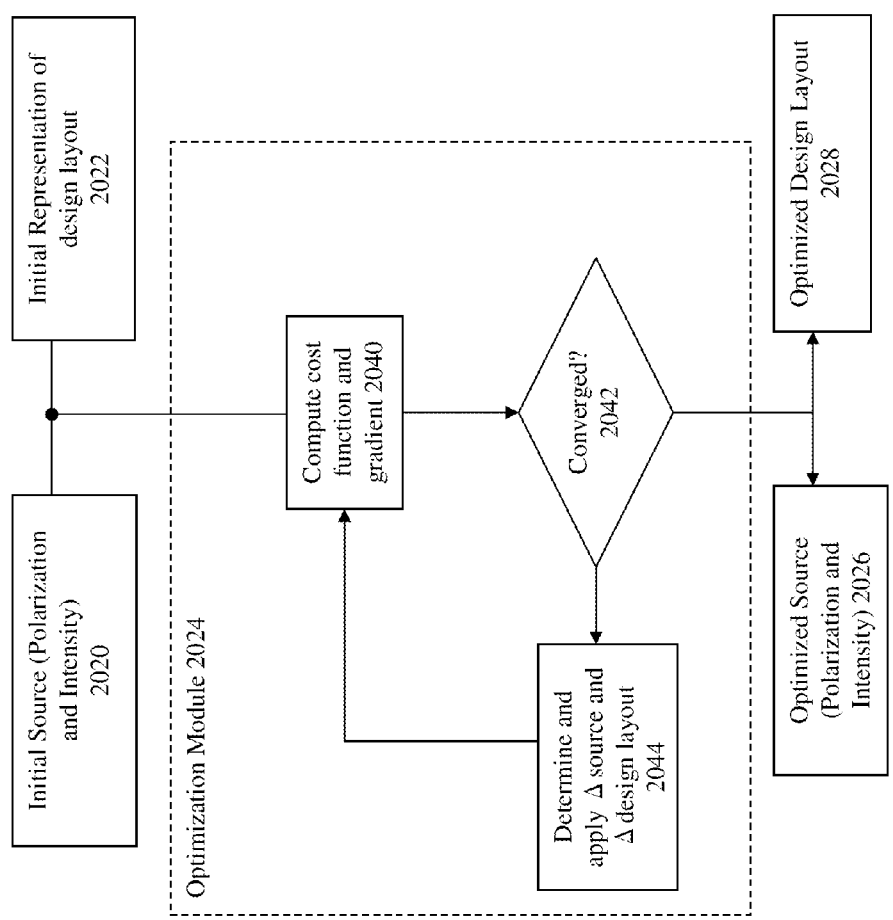
FIG. 20 illustrates a flowchart with the key steps of the optimization process where simulation is done to co-optimize a source and a design layout simultaneously, according to an embodiment of the present invention.

As will be appreciated by one skilled in the art, freeform polarization in the pupil plane gives significant imaging improvements. Those improvements are remarkable for 2 dimensional structures such as random contact holes or contact holes arranged in various pitches. In an embodiment, the critical dimension uniformity (CDU) can be improved by about 19%. In an embodiment, the source mask polarization optimization (SMPO) can be supported by a simulator (for example Tachyon™). FIGS. 18-20 and related description discuss a possible simulation approach to achieve SMPO.

Figure 15:
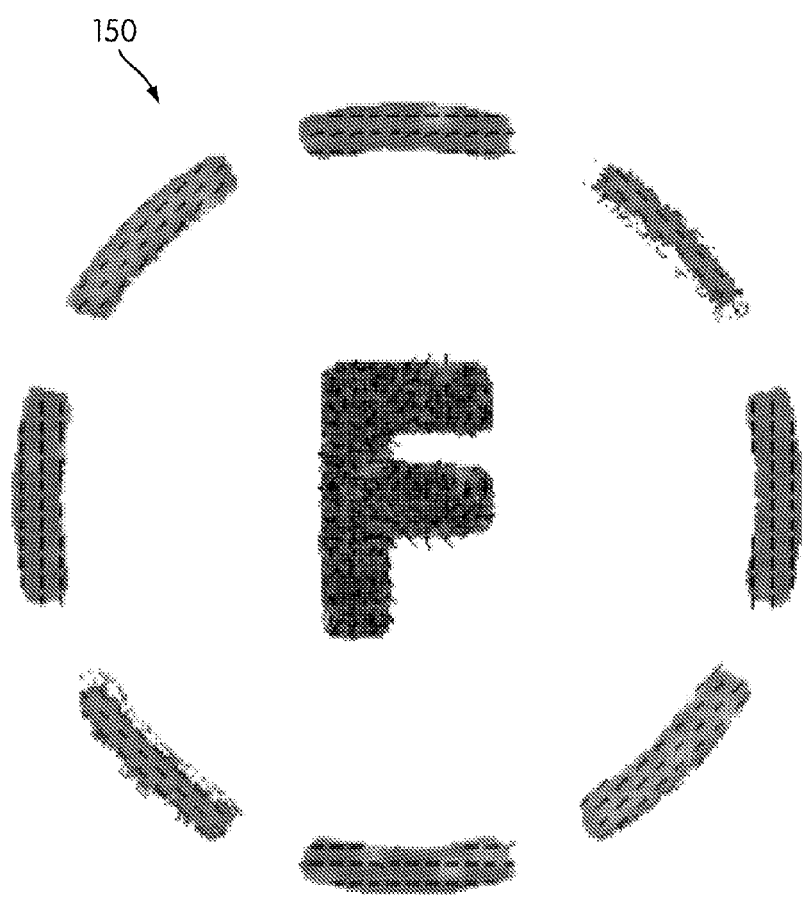
FIG. 15 shows an illumination pattern 150 that can be generated in the pupil plane with the illumination system of FIG. 2 in accordance with an embodiment of the invention.

Referring to FIG. 15, this figure shows an illumination pattern 150 that can be generated in the pupil plane using the illumination system of FIG. 2. In FIG. 15, the pattern 150 includes a plurality of poles arranged along a ring and central pole "F". The plurality of poles have a TE type of polarization and the central pole is unpolarized. It will be appreciated that any types of illumination/polarization shapes can be obtained with the illumination system of FIG. 2.

Figure 16:
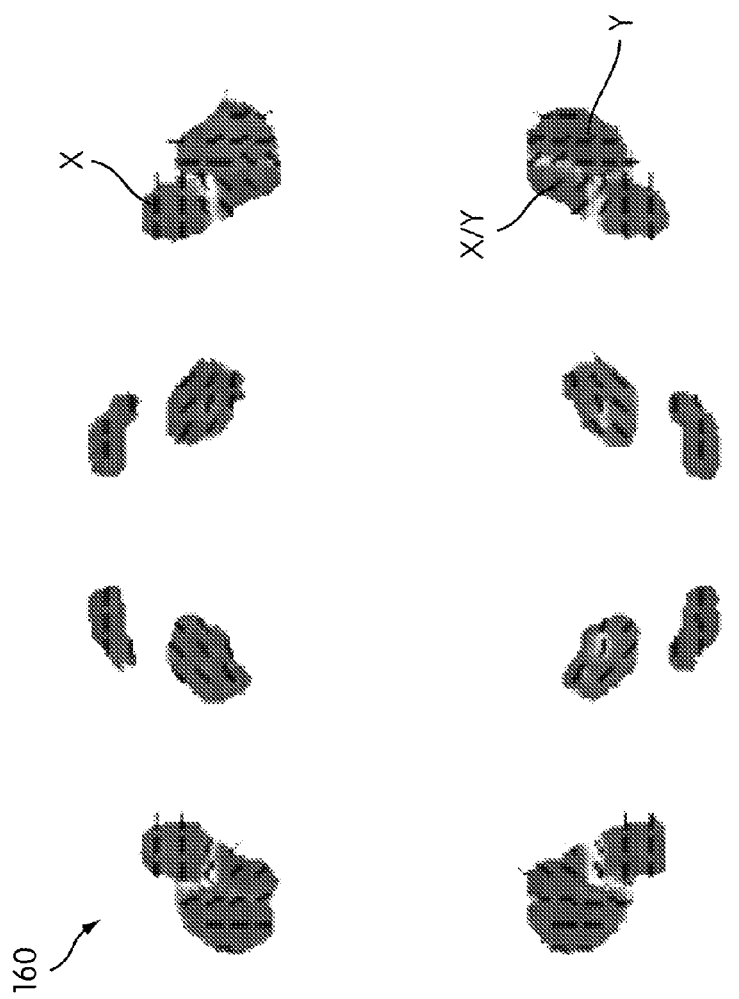
FIG. 16 shows an illumination pattern 160 that can be generated in the pupil plane with the illumination system of FIG. 2 in accordance with an embodiment of the invention.

FIG. 16 shows an illumination pattern 160 that can be generated in the pupil plane using the illumination system of FIG. 2 in accordance with an embodiment of the invention. In FIG. 16, various types of polarization can be generated within a same pole, and the polarization direction varies in the illumination source as indicated by the black lines.

Figure 17:
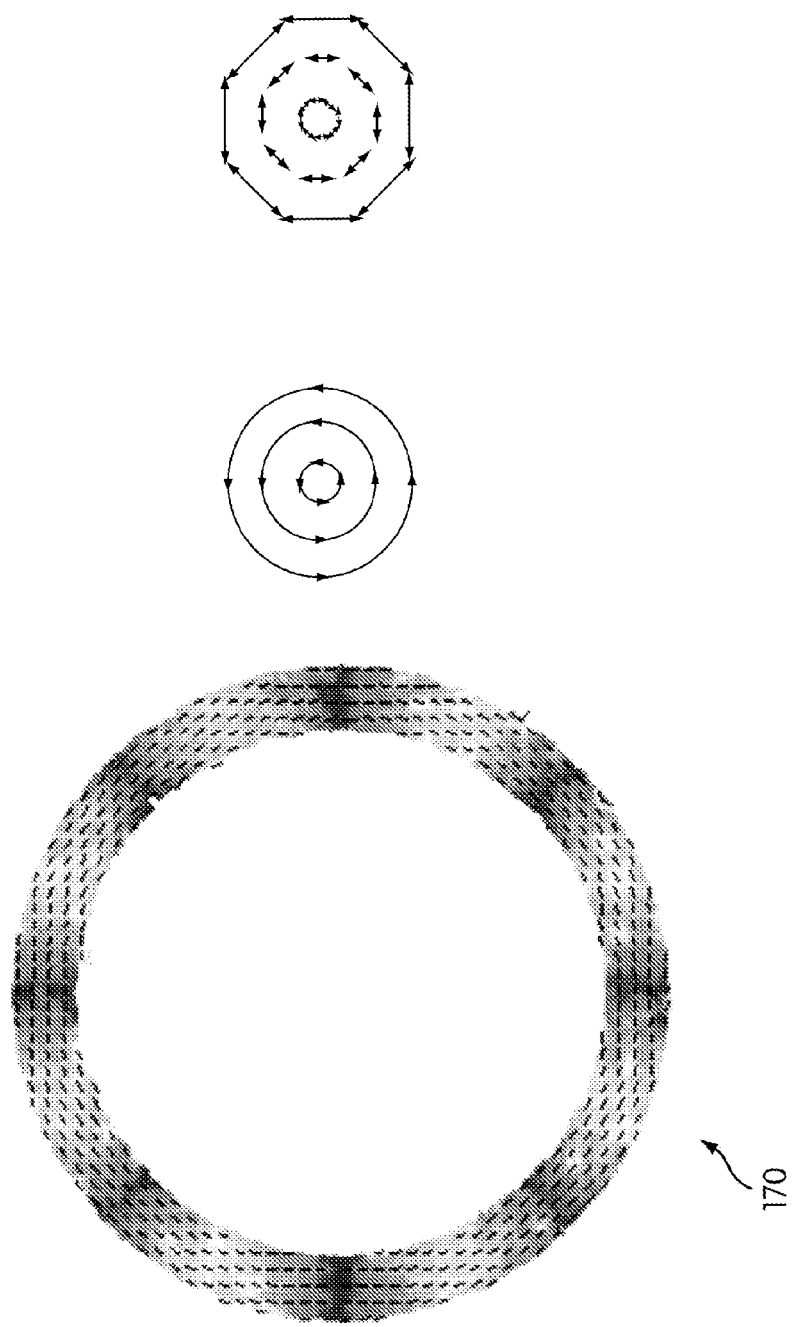
FIG. 17 shows an illumination pattern 170 that can be generated in the pupil plane with the illumination system of FIG. 2 in accordance with an embodiment of the invention.

FIG. 17 shows an illumination pattern 170 that can be generated in the pupil plane using the illumination system of FIG. 2 in accordance with an embodiment of the invention. The illumination pattern 170 includes an azimuthal polarization that mimics the theoretical TE polarization. The polarization is done by steps of 45°. The theoretical limit IPS (intensity in a preferred state) is 85%.

It will be appreciated that the programmable polarization discussed above provides more flexibility as the polarization for each mask layer can be independently optimized. Furthermore, because any polarization (e.g. both X/Y, TE and TM polarizations) can be obtained with the freeform polarization, it is possible to significantly improve the process window and the critical dimension uniformity.

In an embodiment, the illumination shape in the pupil plane can be tuned or optimized with freeform polarization in conjunction with, or independently from, the source optimization.

As discussed before, source and mask need to be co-optimized to achieve the best process window in low-k1 lithography. Existing SMO implementations typically keep source polarization fixed during the co-optimization, while allowing the source intensity to change. It has been recognized that there can be additional benefit by allowing the source polarization to change as well (source mask polarization optimization or SMPO). Existing source polarization optimization techniques can only handle a small and discrete set of source polarization states at each individual source point in the source pupil plane. FIG. 20 illustrates an embodiment that provides improved source polarization optimization algorithm where polarization states of the source points can be continuously varied to harness the full potential of the source optimization process.

In the context of the present invention, the term a "polarization state" encompasses an independent polarization state, or a combined polarization state formed by the combination of more than one independent polarization states. For example, it is assumed that all the polarization states form a linear space. The dimension of this linear space is 4, that is, any polarization state could be formed by linear combinations of a set of 4 basis vectors. There are many different choices of basis vectors, but a particularly convenient choice is a unit matrix and 3 Pauli matrices. Expansion coefficients of the Pauli matrices (and optionally the coefficient of the unit matrix) are used to parameterize the polarization state. Usually 3 parameters are sufficient for the optimization. There may be more parameters, but only 3 of them are linearly independent in a 4-dimensional linear space.

In simple terms, the characteristic representation P of a source point can be expressed as a Hermitian non-negative density matrix, which can be expanded in terms of the unit matrix and the Pauli expansion coefficients:

$$P=P_0+P_1\sigma_1+P_2\sigma_2+P_3\sigma_3,$$

where $\sigma_1$, $\sigma_2$, and $\sigma_3$ are the linearly independent polarization states, and P1, P2, and P3 are their respective expansion coefficients. P0 is equivalent to intensity. It can optionally be factored in or out, as required. For example, to obtain just the polarization characterizations (and not the intensity characterization), P1, P2 and P3 can be normalized as P1/P0, P2/P0 and P3/P0. Usually the following condition is satisfied:

$$P_0^2 \geq P_1^2 + P_1^2 + P_3^2$$

Depending on what a polarization controller hardware can support, one or more of the characteristic parameters can be constrained. For example, if the polarization controller device supports only linearly polarized states, then P2 is set to zero.

The Pauli expansion coefficients P1, P2, P3 (in regular or normalized form) are chosen to create a customizable polarization condition at a particular source point. The customizable polarization condition may comprise a mix of various polarization states. The polarization state at a particular source point is optimized by varying the parameters until the desired lithographic response is simulated.

The aerial image of a design layout illuminated by the preselected group of source points has a linear correspondence with the polarization parameters (and the source intensity. The aerial image $I^s$ at each source point s can be decomposed into contributions from each parameter and the derivatives.

$$I^s(x) = \sum_i P_i I_i^s(x)$$

$$\frac{\partial I^s(x)}{\partial P_i} = I_i^s(x)$$

The total aerial image is a summation over all source points:

$$I(x) = \sum_s I^s(x)$$

It will be elaborated later that choosing a right cost function that represents the aerial image, and minimizing the cost function with respect to the polarization parameters, the source polarization at each source point can be optimized.

Prior to discussing the parametric approach to polarization optimization of the present invention, a brief discussion regarding the overall simulation and imaging process is provided. FIG. 18 illustrates an exemplary lithographic projection system 1810. The major components are a light source 1812, which may be a deep-ultraviolet excimer laser source, illumination optics which define the partial coherence (denoted as sigma) and which may include specific source shaping optics 1814, 1816*a* and 1816*b*; a mask or reticle 1818; and projection optics 1816*c* that produce an image of the reticle pattern onto the wafer plane 1822. An adjustable filter or aperture 1820 at the pupil plane may restrict the range of beam angles that impinge on the wafer plane 1822, where the largest possible angle defines the numerical aperture of the projection optics $NA=\sin(\Theta_{max})$.

In a lithography simulation system, these major system components can be described by separate functional modules, for example, as illustrated in FIG. 19. Referring to FIG. 19, the functional modules include the design layout module 1926, which defines the target design; the mask layout module 1928, which defines the mask to be utilized in the imaging process; the mask model module 1930, which defines the model of the mask layout to be utilized during the simulation process; the optical model module 1932, which defines the performance of the optical components of lithography system; and the resist model module 1934, which defines the performance of the resist being utilized in the given process. As is known, the result of the simulation process produces, for example, predicted contours and CDs in the result module 1936.

More specifically, it is noted that the properties of the illumination and projection optics are captured in the optical model 1932 that includes, but not limited to, NA-sigma (σ) settings as well as any particular illumination source shape (e.g. off-axis light sources such as annular, quadrupole, and dipole, etc.). The optical properties of the photo-resist layer coated on a substrate—i.e. refractive index, film thickness, propagation and polarization effects—may also be captured as part of the optical model 1932. The mask model 1930 captures the design features of the reticle and may also include a representation of detailed physical properties of the mask. Finally, the resist model 1934 describes the effects of chemical processes which occur during resist exposure, PEB and development, in order to predict, for example, contours of resist features formed on the substrate wafer. The objective of the simulation is to accurately predict, for example, edge placements and CDs, which can then be compared against the target design. The target design, is generally defined as the pre-OPC mask layout, and will be provided in a standardized digital file format such as GDSII or OASIS.

In a typical high-end design almost every feature edge requires some modification in order to achieve printed patterns that come sufficiently close to the target design. These modifications may include shifting or biasing of edge positions or line widths as well as application of 'assist' features that are not intended to print themselves, but will affect the properties of an associated primary feature. Furthermore, optimization techniques applied to the source of illumination may have different effects on different edges and features. Optimization of illumination sources can include the use of pupils to restrict source illumination to a selected pattern of light. The present invention provides optimization methods that can be applied to both source and mask configurations simultaneously.

With reference to a high-level block diagram in FIG. 20, certain embodiments of the present invention provide methods for accelerated and simultaneous optimization of mask and source. For simplicity, a representation of a design layout is sometimes described as "mask," though persons skilled in the art will understand that in the simulation domain, no physical mask is required. Initial source representation 2020 includes intensity and polarization state information for each source point in a preselected group of source points in the pupil plane, and initial design layout representation 2022 includes transmission and/or phase information at various coordinate points on the design layout. Initial configurations of the source 2020 and design layout 2022 (e.g. corresponding to optical model 1932 and mask model 1930 described above, respectively) are supplied to an optimization module 2024. Optimization module 2024 comprises an iterative optimizer that calculates a cost function and a gradient for each iteration. At 2040, a cost function for the design layout and source is evaluated for each iteration. The gradient of the cost function can then be examined at 2042 to determine if convergence has been obtained. If the gradient is non-zero, then it may be considered that convergence has not been achieved and changes to source and design layout can be calculated and applied at 2044 before repeating the steps of computing a cost function and gradient for the new design layout and source at 2040 and testing for convergence 2042. When convergence has been achieved, the final source 2026 and design layout 2028 are considered to be optimized.

Changes to the source and design layout in 2044 can be calculated and/or performed in a variety of ways, and it is not necessary for the exact sequence shown in FIG. 20 to be followed in all embodiments. For example, optimal results can be obtained by performing an unconstrained (or significantly less constrained) optimization followed by a fully constrained optimization step. The relative more freedom in the unconstrained (or less constrained) optimization step means it is likely to reach an optimal solution in a global sense. The fully constrained optimization would then start from an initial condition derived from this solution. Persons skilled in the art will understand that physical hardware-related restrictions applicable to a polarization optimization at a particular source point can be characterized in the simulation in terms of a set of constraints. The physical hardware-related restriction may include the number of different polarization states that can be physically created by a polarization controller device. Another possible physical hardware limitation may be the dependency on the location of one or more optical elements (such as reflective mirrors or other optical elements (reflective/refractive/diffractive/transmissive) that direct light towards the particular source point.

It is to be noted that even if due to physical hardware-related restrictions, a polarization algorithm may only support a subset of all theoretically possible polarization states, the subset is still bigger than what the existing algorithms can handle. Furthermore, the present algorithm is flexible and backward compatible in the sense that by changing the simulation constraints, it can recreate the results of the existing algorithms, where each source point is optimized with respect to a finite discrete set of polarization states.

Referring back to step 2040 in FIG. 20, certain aspects of the invention include significantly speeding up the convergence of the optimization by allowing direct computation of the gradient of the cost function. The methods include the use of linearized functions selected to optimize the printed wafer contour throughout the process window. Examples of cost functions suitable for use in the present invention can be found in U.S. provisional application No. 61/116,788, filed Nov. 21, 2008, which described cost functions used for the process of Source Mask Optimization (SMO). Similar cost functions can be used in the present application as well for enhancement of the existing SMO operation by optimizing both source intensity and source polarization.

In one example, the cost function may be selected to reduce the worst edge placement error of a design layout throughout the process window. Mathematically, the cost function F may be written as:

$$F = \max_{pw} \max_{e} EPE(pw, e)$$

where pw is a list of process window conditions and variable e runs over a set of evaluation points placed along the design layout.

This cost function could be transformed into a more computationally efficient form, as discussed in the U.S. 61/116,788 application, by employing the following approximations.

First, EPE is approximated by a linearized approximation, $$EPE(pw, e) \approx \frac{[I_{pw}(e) - I_{th}]}{\|\nabla I_{pw}\|},$$

where $I_{pw}(e)$ denotes the aerial image intensity at process window condition pw, and $I_{th}$ the threshold for the aerial image contour. The denominator, $\|\nabla I_{pw}\|$, represents the slope of aerial image.

Next, the max operator is approximated by an $L_p$ norm, $$F^p \approx \sum_{pw} \sum_{e} EPE^p(pw, e),$$

with p a positive integer. The bigger the value of p, the better this approximation is.

Putting everything together, we have this new cost function, $$F = \sum_{pw} \sum_{x} w(pw, x) \frac{[I_{pw}(x) - I_{th}]^p}{\|\nabla I_{pw}\|^p}, \ p \in N.$$

As can be seen, a weighting factor w(pw,e) is also preferably introduced to provide extra flexibility to control the goal of the optimization, which could be determined from considerations like evaluation point location (e.g. line, line end, jog) or relevant feature size (e.g. line width, space), or process window position.

Those skilled in the art will recognize many ways how the mask transmissions M(x) and source intensities S(s) can be derived from the received source and mask descriptions (e.g. pixel-based maps corresponding to mask model 1930 and optical model 1932, respectively), and so details thereof will be omitted here for the sake of clarity of the invention. The present inventors recognize that aerial intensity I can be regarded as a function of mask transmissions M(x) and source intensities S(s), and therefore so can the cost function F. The cost function may be expanded using a Taylor series and, in certain embodiments, the floor of the gradient may be discovered using first order terms. More particularly, F may be expressed as:

$$F = F[I(S(s), M(x))]$$

In the equation, s is the coordinate of the source point in the pupil plane, and x is the coordinate of the design layout or mask. This cost function may be minimized using any of a variety of known algorithms when the gradient or derivatives of F are computed with respect to M and S. It is possible to keep the mask constant and only vary the source. Variation of source may comprise variation of polarization state at constant intensity or variation of both the polarization state and the intensity.

Replacing S(s) with the polarization parameters $P_i(s)$, the above function F can be rewritten as:

$$F = F[I(P_i(s), M(x))]$$

And the derivative with respect to the polarization parameter is (with the mask side gradient constant):

$$\frac{\delta F}{\delta P_i(s)} = \int dx' \frac{\delta F}{\delta I(x')} \frac{\delta I(x')}{\delta P_i(s)} = \int dx' \frac{\delta F}{\delta I(x')} I_i^s(x')$$

Minimization of this gradient leads to the convergence of the optimization algorithm, and as shown in FIG. 20, a final optimized source 2026 is obtained. Simultaneously, an optimized mask or design layout 2028 is also obtained that together with optimized source, provides the desired lithographic performance within a predefined process window.

The descriptions above provide an example embodiment where the cost function is based on EPE. Examples of other cost functions include (1) the EPE least square function, (2) the EPE least p-norm function where p is even and greater than 2, (3) the inverse NILS p-norm function, (4) the contour integral of image slope with M as the design target, (5) the edge image value least square, (6) the edge image p-norm (p is even and >2) and (7) the ILS p-norm with F to be maximized. The seven corresponding cost function equations are listed below:

$$F = \sum_{pw} \sum_{x} w(pw, x) \frac{[I_{pw}(x) - I_{th}]^2}{\|\nabla I_{pw}\|^2} \quad (1)$$

$$F = \sum_{pw} \sum_{x} w(pw, x) \frac{[I_{pw}(x) - I_{th}]^p}{\|\nabla I_{pw}\|^p} \quad (2)$$

$$F = \sum_{pw} \sum_{x} w(pw, x) \frac{[I_{pw}(x)]^p}{\|CD_x \nabla I_{pw}\|^p} \quad (3)$$

$$F = -\sum_{pw} \oint dl w(pw, x)(\hat{n} \cdot \nabla I_{pw}) \quad (4)$$

$$= -\sum_{pw} \int_{M}^{\partial M} \int dS \nabla \cdot (w(pw, x) \nabla I_{pw})$$

$$F = \sum_{pw} \sum_{x} w(pw, x)[I_{pw}(x) - I_{th}]^2 \quad (5)$$

$$F = \sum_{pw} \sum_{x} w(pw, x)[I_{pw}(x) - I_{th}]^p \quad (6)$$

$$F = \sum_{pw} \sum_{x} w(pw, x) \frac{\|\nabla I_{pw}\|^p}{CD_x} \quad (7)$$

One skilled in the art would fully understand how to determine the optimized gradient for these and other cost functions based after being taught by the above descriptions. For example, some standard optimization techniques utilize gradient information such as steepest descent, conjugation gradient or quasi-Newton methods.

The gradient calculation formulae described above can be implemented in various computing platforms. Additionally or alternatively, specially adapted hardware acceleration platforms can be used to further improve the optimization speed. For example, platforms can that include specialized digital signal processors ("DSPs") can be employed to process cost functions and calculate gradients. However, it will be appreciated that calculations maybe performed on other computing platforms that can comprise parallel processors, mathematical coprocessors and DSP based coprocessors.

Figure 21:
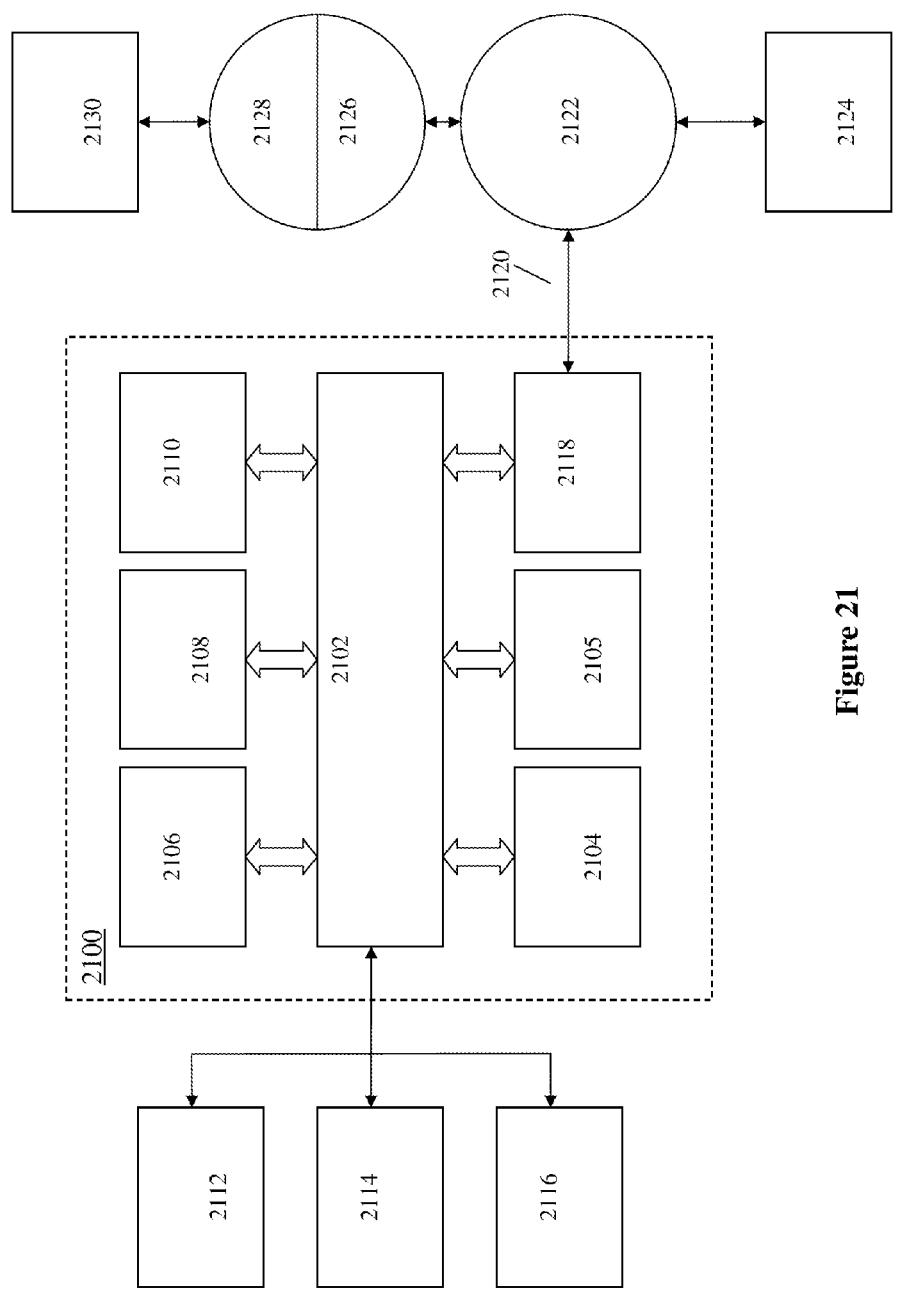
FIG. 21 illustrates various components of a computer system that is used to implement the present invention.

FIG. 21 is a block diagram that illustrates a computer system 2100 which can assist in implementing the optimization methods and flows disclosed herein. Computer system 2100 includes a bus 2102 or other communication mechanism for communicating information, and a processor 2104 coupled with bus 2102 for processing information. Computer system 2100 also includes a main memory 2106, such as a random access memory (RAM) or other dynamic storage device, coupled to bus 2102 for storing information and instructions to be executed by processor 2104. Main memory 2106 also may be used for storing temporary variables or other intermediate information during execution of instructions to be executed by processor 2104. Computer system 2100 further includes a read only memory (ROM) 2108 or other static storage device coupled to bus 2102 for storing static information and instructions for processor 2104. A storage device 2110, such as a magnetic disk or optical disk, is provided and coupled to bus 2102 for storing information and instructions.

Computer system 2100 may be coupled via bus 2102 to a display 2112, such as a cathode ray tube (CRT) or flat panel or touch panel display for displaying information to a computer user. An input device 2114, including alphanumeric and other keys, is coupled to bus 2102 for communicating information and command selections to processor 2104. Another type of user input device is cursor control 2116, such as a mouse, a trackball, or cursor direction keys for communicating direction information and command selections to processor 2104 and for controlling cursor movement on display 2112. This input device typically has two degrees of freedom in two axes, a first axis (e.g., x) and a second axis (e.g., y), that allows the device to specify positions in a plane. A touch panel (screen) display may also be used as an input device.

According to one embodiment of the invention, portions of the optimization process may be performed by computer system 2100 in response to processor 2104 executing one or more sequences of one or more instructions contained in main memory 2106. Such instructions may be read into main memory 2106 from another computer-readable medium, such as storage device 2110. Execution of the sequences of instructions contained in main memory 2106 causes processor 2104 to perform the process steps described herein. One or more processors in a multi-processing arrangement may also be employed to execute the sequences of instructions contained in main memory 2106. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 2104 for execution. Such a medium may take many forms, including but not limited to, non-volatile media, volatile media, and transmission media. Non-volatile media include, for example, optical or magnetic disks, such as storage device 2110. Volatile media include dynamic memory, such as main memory 2106. Transmission media include coaxial cables, copper wire and fiber optics, including the wires that comprise bus 2102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 2104 for execution. For example, the instructions may initially be borne on a magnetic disk of a remote computer. The remote computer can load the instructions into its dynamic memory and send the instructions over a telephone line using a modem. A modem local to computer system 2100 can receive the data on the telephone line and use an infrared transmitter to convert the data to an infrared signal. An infrared detector coupled to bus 2102 can receive the data carried in the infrared signal and place the data on bus 2102. Bus 2102 carries the data to main memory 2106, from which processor 2104 retrieves and executes the instructions. The instructions received by main memory 2106 may optionally be stored on storage device 2110 either before or after execution by processor 2104.

Computer system 2100 also preferably includes a communication interface 2118 coupled to bus 2102. Communication interface 2118 provides a two-way data communication coupling to a network link 2120 that is connected to a local network 2122. For example, communication interface 2118 may be an integrated services digital network (ISDN) card or a modem to provide a data communication connection to a corresponding type of telephone line. As another example, communication interface 2118 may be a local area network (LAN) card to provide a data communication connection to a compatible LAN. Wireless links may also be implemented. In any such implementation, communication interface 2118 sends and receives electrical, electromagnetic or optical signals that carry digital data streams representing various types of information.

Network link 2120 typically provides data communication through one or more networks to other data devices. For example, network link 2120 may provide a connection through local network 2122 to a host computer 2124 or to data equipment operated by an Internet Service Provider (ISP) 2126. ISP 2126 in turn provides data communication services through the worldwide packet data communication network, now commonly referred to as the "Internet" 2128. Local network 2122 and Internet 2128 both use electrical, electromagnetic or optical signals that carry digital data streams. The signals through the various networks and the signals on network link 2120 and through communication interface 2118, which carry the digital data to and from computer system 2100, are exemplary forms of carrier waves transporting the information.

Computer system 2100 can send messages and receive data, including program code, through the network(s), network link 2120, and communication interface 2118. In the Internet example, a server 2130 might transmit a requested code for an application program through Internet 2128, ISP 2126, local network 2122 and communication interface 2118. In accordance with the invention, one such downloaded application provides for the illumination optimization of the embodiment, for example. The received code may be executed by processor 2104 as it is received, and/or stored in storage device 2110, or other non-volatile storage for later execution. In this manner, computer system 2100 may obtain application code in the form of a carrier wave.

It will be appreciated that the different acts involved in configuring the illumination source may be executed according to machine executable instructions or codes. These machine executable instructions may be embedded in a data storage medium, e.g., of a control unit of the lithographic apparatus. The control unit may include a processor that is configured to control the adjusting device AM and to modify the cross-sectional intensity distribution in the beam exiting the illumination system IL. The processor may be configured to execute the instructions.

While much of the description has been in terms of optimization, optimization need not be performed all or part of the time or for all parts of the illumination and/or pattern/patterning device. For example, the source and/or polarization optimization may be performed completely or partially "sub-optimally" for expedience, due to imaging requirements, for parts of the patterning device/pattern, etc.

Software functionalities of a computer system involving programming, including executable codes, may be used to implement the above described imaging model. The software code may be executable by a general-purpose computer. In operation, the code and possibly the associated data records may be stored within a general-purpose computer platform. At other times, however, the software may be stored at other locations and/or transported for loading into an appropriate general-purpose computer system. Hence, the embodiments discussed above involve one or more software or computer products in the form of one or more modules of code carried by at least one machine-readable medium. Execution of such codes by a processor of the computer system enables the platform to implement the functions in essentially the manner performed in the embodiments discussed and illustrated herein.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm).

The term "lens", where the context allows, may refer to any one or combination of various types of optical components, including refractive, reflective, magnetic, electromagnetic and electrostatic optical components.

The invention may further be described using the following clauses:

1. A computer-implemented method for improving a lithographic process simulation, comprising:
representing each source point in a preselected group of source points at a pupil plane of an illumination source by one or more variable parameters, wherein at least some of the one or more variable parameters characterize a polarization state at the source point;
forming a cost function comprising an aerial image intensity of a representation of a design layout projected using the preselected group of source points;
computing a gradient of the cost function with respect to the at least some of the one or more variable parameters;
iteratively reconfiguring one or both of the preselected group of source points in the illumination source and the representation of the design layout based on the computed gradient until a desired lithographic response is obtained.

2. The method of clause 1, wherein the preselected group of source point in the illumination source and the representation of the design layout are optimized when the computed gradient has a value substantially equal to zero.

3. The method of clause 1, wherein the one or more variable parameters characterizing the polarization state comprise expansion coefficients of a Hermitian density matrix.

4. The method of clause 1, wherein physical hardware-related restriction of possible polarization states at a particular source point is characterized in the simulation in terms of a set of constraints.

5. The method of clause 4, wherein physical hardware-related restriction comprises one or both of the following: number of different polarizaton states that can be physically created by polarization controller device, and dependency on the location of one or more optical elements that direct light towards the particular source point.

6. The method of clause 5, wherein the one or more optical elements collectively shape a cross section of a radiation beam by providing a flexible set of source points in the pupil plane of the illumination source.

7. The method of clause 1, wherein the method further comprises:
keeping the representation of the design layout constant during the iteration, while the polarization of the illumination source is optimized.

8. A method for optimizing a lithographic process, comprising:
representing each source point in a preselected group of source points at a pupil plane of an illumination source by one or more variable parameters in a simulation of the lithographic process, wherein at least some of the one or more variable parameters characterize a polarization state at the source point;
iteratively reconfiguring one or both of the preselected group of source points in the illumination source and a representation of the design layout based on a computed gradient of a cost function with respect to the at least some of the one or more variable parameters until a desired lithographic response is obtained, wherein the cost function comprises an aerial image intensity of a representation of the design layout projected using the preselected group of source points.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A computer-implemented method for improving a lithographic process simulation, comprising:
representing each source point in a group of source points at a pupil plane of an illumination source by one or more variable parameters, wherein at least some of the one or more variable parameters characterize a polarization state at individual ones of the source points, wherein the one or more variable parameters create a customizable polarization condition at a particular source point, wherein the customizable polarization condition at the particular source point comprises a mix of two or more different polarization states;
forming a cost function comprising an aerial image intensity of a representation of a design layout projected using the group of source points;
computing a gradient of the cost function with respect to the at least some of the one or more variable parameters;
iteratively reconfiguring one or both of the group of source points in the illumination source and the representation of the design layout based on the computed gradient until a desired lithographic response is obtained.

2. The method of claim 1, wherein at least some of the one or more variable parameters further characterize an intensity at each of the source points.

3. The method of claim 1, wherein the group of source points in the illumination source and the representation of the design layout are optimized for a lithographic parameter of the lithographic process.

4. The method of claim 3, wherein the lithographic parameter of the lithographic process includes one or more of: critical dimension uniformity, a process window, a dimension of the process window, MEEF, maximum NILS, and maximum NILS in defocus.

5. The method of claim 1, wherein physical hardware-related restriction of possible polarization states at a particular source point is characterized in the simulation in terms of a set of constraints.

6. The method of claim 1, wherein the cost function is formulated in terms of: an edge placement error over a given process window, an inverse normalized image log slope, a contour integral of image slope, an edge image value, and an image log slope value.

7. The method of claim 1, wherein each of the two or more different polarization states consists of one of an unpolarized state, a Y polarization state, a X polarization state, a X/Y polarization state, a TE polarization state and a TM polarization state.

8. A method for improving a lithographic process, comprising:

representing each source point in a group of source points at a pupil plane of an illumination source by one or more variable parameters in a simulation of the lithographic process, wherein at least some of the one or more variable parameters characterize a polarization state at each of the source points, wherein the one or more variable parameters create a customizable polarization condition at a particular source point, wherein the customizable polarization condition at the particular source point comprises a mix of two or more different polarization states;

iteratively reconfiguring one or both of the group of source points in the illumination source and a representation of the design layout based on a computed gradient of a cost function with respect to the at least some of the one or more variable parameters until a desired lithographic response is obtained, wherein the cost function comprises an aerial image intensity of a representation of the design layout projected using the group of source points.

9. The method of claim 8, wherein at least some of the one or more variable parameters further characterize an intensity at each of the source points.

10. The method of claim 8, wherein the group of source points in the illumination source and the representation of the design layout are optimized for a lithographic parameter of the lithographic process.

11. The method of claim 10, wherein the lithographic parameter of the lithographic process includes one or more of: critical dimension uniformity, a process window, a dimension of the process window, MEEF, maximum NILS, and maximum NILS in defocus.

12. The method of claim 8, wherein the group of source points in the illumination source and the representation of the design layout are optimized when the computed gradient has a value substantially equal to zero.

13. The method of claim 8, wherein the one or more variable parameters characterizing the polarization state comprise expansion coefficients of a Hermitian density matrix.

14. The method of claim 8, wherein physical hardware-related restriction of possible polarization states at a particular source point is characterized in the simulation in terms of a set of constraints.

15. The method of claim 14, wherein physical hardware-related restriction comprises one or both of the following: number of different polarization states that can be physically created by a polarization controller device, and dependency on the location of one or more optical elements that direct light towards the particular source point.

16. The method of claim 15, wherein the one or more optical elements collectively shape a cross section of a radiation beam by providing a flexible set of source points in the pupil plane of the illumination source.

17. The method of claim 8, wherein the cost function is formulated in terms of: an edge placement error over a given process window, an inverse normalized image log slope, a contour integral of image slope, an edge image value, and an image log slope value.

18. The method of claim 8, wherein the method further comprises:
keeping the representation of the design layout constant during the iteration, while the polarization of the illumination source is optimized.

19. The method of claim 8, wherein each of the two or more different polarization states consists of one of an unpolarized state, a Y polarization state, a X polarization state, a X/Y polarization state, a TE polarization state and a TM polarization state.

20. A computer-implemented method for improving a lithographic process simulation, comprising:
representing each source point in a group of source points at a pupil plane of an illumination source by one or more variable parameters, wherein at least some of the one or more variable parameters characterize a polarization state and an intensity at the source points, wherein the one or more variable parameters create a customizable polarization condition at a particular source point, wherein the customizable polarization condition at the particular source point comprises a mix of two or more different polarization states;

forming a cost function comprising an aerial image intensity of a representation of a design layout projected using the group of source points;

computing a gradient of the cost function with respect to the at least some of the one or more variable parameters;

iteratively reconfiguring one or both of the group of source points in the illumination source and the representation of the design layout based on the computed gradient until a desired lithographic response is obtained.

* * * * *